US009977452B2

(12) United States Patent
Abu Qahouq

(10) Patent No.: US 9,977,452 B2
(45) Date of Patent: May 22, 2018

(54) MULTI-INPUT OR MULTI-OUTPUT ENERGY SYSTEM ARCHITECTURES AND CONTROL METHODS

(71) Applicant: Board of Trustees of The University of Alabama, Tuscaloosa, AL (US)

(72) Inventor: Jaber A. Abu Qahouq, Tuscaloosa, AL (US)

(73) Assignee: Board of Trustees of the University of Alabama, Tuscaloosa, AL (US)

( * ) Notice: Subject to any disclaimer, the term of this patent is extended or adjusted under 35 U.S.C. 154(b) by 376 days.

(21) Appl. No.: 14/639,616

(22) Filed: Mar. 5, 2015

(65) Prior Publication Data

US 2015/0270709 A1 Sep. 24, 2015

Related U.S. Application Data

(60) Provisional application No. 61/949,285, filed on Mar. 7, 2014.

(51) Int. Cl.
*G05F 1/67* (2006.01)
*H02J 1/10* (2006.01)
*H01L 31/02* (2006.01)
*H02J 3/38* (2006.01)
*H02J 7/00* (2006.01)

(52) U.S. Cl.
CPC .......... *G05F 1/67* (2013.01); *H01L 31/02021* (2013.01); *H02J 1/108* (2013.01); *H02J 3/385* (2013.01); *H02J 7/0063* (2013.01); *Y02E 10/58* (2013.01); *Y10T 307/391* (2015.04); *Y10T 307/696* (2015.04)

(58) Field of Classification Search
CPC ....................................................... H02J 7/34
See application file for complete search history.

(56) References Cited

U.S. PATENT DOCUMENTS

| 6,262,558 | B1 * | 7/2001 | Weinberg | B64G 1/428 |
| | | | | 136/291 |
| 7,199,641 | B2 * | 4/2007 | Wei | H02M 3/073 |
| | | | | 327/293 |
| 7,514,900 | B2 * | 4/2009 | Sander | H02J 7/008 |
| | | | | 320/101 |

(Continued)

FOREIGN PATENT DOCUMENTS

WO 2010/030767 3/2010

OTHER PUBLICATIONS

Abdelsalam, A.K., et al., "High-Performance Adaptive Perturb and Observe MPPT Technique for Photovoltaic-Based Microgrids," IEEE Transactions on Power Electronics, vol. 26, No. 4, 2011, pp. 1010-1021.

(Continued)

*Primary Examiner* — Jeffrey Zweizig
(74) *Attorney, Agent, or Firm* — Meunier Carlin & Curfman LLC

(57) ABSTRACT

Systems and methods for efficiently controlling energy sources are disclosed. In one example, a system for processing and storing energy may include a plurality of cells that store energy and a plurality of power switches coupled to the cells. The system may also include an inductor coupled to the power switches and a controller, wherein the controller controls the power switches to transfer the energy to a load.

24 Claims, 23 Drawing Sheets

(56) References Cited

U.S. PATENT DOCUMENTS

| | | | | |
|---|---|---|---|---|
| 7,839,022 | B2* | 11/2010 | Wolfs | G05F 1/67 307/75 |
| 8,487,481 | B2 | 7/2013 | Cook et al. | |
| 8,872,384 | B2* | 10/2014 | Stratakos | H02J 3/383 307/104 |
| 9,203,121 | B2* | 12/2015 | Liu | H02J 7/0016 |
| 9,203,246 | B2* | 12/2015 | Kang | H02J 7/0014 |
| 9,225,179 | B2* | 12/2015 | Liu | H02J 7/0019 |
| 9,325,176 | B2* | 4/2016 | Siri | H02J 3/385 |
| 9,331,499 | B2* | 5/2016 | Ikriannikov | H02J 1/10 |
| 9,490,645 | B2* | 11/2016 | Shi | H02J 7/0054 |
| 9,583,957 | B2* | 2/2017 | Hong | H02J 7/0054 |
| 2002/0090974 | A1 | 7/2002 | Hagn | |
| 2006/0025181 | A1 | 2/2006 | Kalofonos et al. | |
| 2007/0109121 | A1 | 5/2007 | Cohen | |
| 2007/0149138 | A1 | 6/2007 | Das | |
| 2007/0298846 | A1 | 12/2007 | Greene et al. | |
| 2008/0205897 | A1 | 8/2008 | Neenan et al. | |
| 2009/0108679 | A1 | 4/2009 | Porwal | |
| 2009/0312046 | A1 | 12/2009 | Clevenger et al. | |
| 2011/0218014 | A1 | 9/2011 | Abu-Qahouq | |
| 2011/0316344 | A1* | 12/2011 | Van Lammeren | H01M 10/42 307/77 |
| 2013/0076310 | A1* | 3/2013 | Garnier | H02J 7/0016 320/118 |
| 2013/0320914 | A1* | 12/2013 | Li | H02J 7/0014 320/103 |
| 2015/0340886 | A1* | 11/2015 | Sung | H01M 10/441 320/118 |

OTHER PUBLICATIONS

Abu Qahouq, J.A., et al., "Adaptive Controller with Mode Tracking and Parametric Estimation," IEEE, 2007, pp. 1568-1574.

Abu Qahouq, J.A., "Control Scheme for Sensorless Operation and Detection of CCM and DCM Operation Modes in Synchronous Switching Power Converters," IEEE Transactions on Power Electronics, vol. 25, No. 10, 2010, pp. 2489-2495.

Abu Qahouq, J.A., et al., "Online Closed-Loop Autotuning Digital Controller for Switching Power Converters," IEEE Transactions on Industrial Electronics, vol. 60, No. 5, 2013, pp. 1747-1758.

Abu Qahouq, J.A., et al., "Power Converter With Digital Sensorless Adaptive Voltage Positioning Control Scheme," IEEE Transactions on Industrial Electronics, vol. 58, No. 9, 2007, pp. 4105-4116.

Abu Qahouq, J.A., et al., "Sensorless Current Sharing Analysis and Scheme for Multiphase Converters," IEEE, 2007, pp. 2029-2036.

Agamy, M.S., et al., "A High-Power-Density DC-DC Converter for Distributed PV Architectures," IEEE Journal of Photovoltaics, vol. 3, No. 2, 2013, pp. 791-798.

Arikatla, V., et al., Adaptive Control Methods for DC-DC Switching Power Converters, A Dissertation, 2011, 152 pages.

Arikatla, V., et al., Adaptive digital proportional-integral-derivative controller for power converters, IET Power Electronics, vol. 5, No. 3, 2011, pp. 341-348.

Bakas, P., et al., "Impact of PV Module Mismatch on the PV Array Energy Yield and Comparison of Module, String and Central MPPT," IEEE, 2011, pp. 1393-1398.

Barchowsky, J.P., et al., "A comparative study of MPPT methods for distributed photovoltaic generation," in proceedings of IEEE conference of Innovative Smart Grid Technologies (ISGT), 2012, pp. 1-7.

Bidram, A., et al., "Control and Circuit Techniques to Mitigate Partial Shading Effects in Photovoltaic Arrays," IEEE Journal of Photovoltaics, vol. 2, No. 4, 2012, pp. 532-546.

Chang, Y.C., et al., "Development and Operational Control of Two-String Maximum Power Point Trackers in DC Distribution Systems," IEEE Transactions on Power Electronics, vol. 28, No. 4, 2013, pp. 1852-1861.

Chen, Y.-M., et al., "Multi-Input Converter with Power Factor Correction and Maximum Power Point Tracking Features," IEEE, 2002, pp. 490-496.

Chen, Y.-M., et al., "Multi-Input Inverter for Grid-Connected Hybrid PV/Wind Power System," IEEE Transactions on Power Electronics, vol. 22, No. 3, 2007, pp. 1070-1077.

de Brito, M.A.G., et al., "Evaluation of the Main MPPT Techniques for Photovoltaic Applications," IEEE Transactions on Industrial Electronics, vol. 60, No. 3, 2013, pp. 1156-1167.

Dolara, A., et al., "Performance Analysis of a Single-Axis Tracking PV System," IEEE Journal of Photovoltaics, vol. 2, No. 4, 2012, pp. 524-531.

Femia, N., et al., "Optimization of Perturb and Observe Maximum Power Point Tracking Method," IEEE Transactions on Power Electronics, vol. 20, No. 4, 2005, pp. 963-973.

Hosseini, S.H., et al., "Multi-Input DC Boost Converter for Grid Connected Hybrid PV/FC/Battery Power System," IEEE Electric Power and Energy Conference (EPEC), 2010, 6 pages.

Jiang, Y., et al., "Adaptive Step Size With Adaptive-Perturbation-Frequency Digital MPPT Controller for a Single-Sensor Photovoltaic Solar System," IEEE Transactions on Power Electronics, vol. 28, No. 7, 2013, pp. 3195-3205.

Jiang, Y., et al., "Energy Efficient Fine-grained Approach for Solar Photovoltaic Management System," IEEE, 2011, 4 pages.

Jiang, Y., et al., "Multiple Solar Panels Maximum Power Point Tracking Using the Output Current," IEEE, 2011, 5 pages.

Jiang, Y., et al., "PV System Matlab Simulation Model for Two MPPT Methods," International Review on Modelling and Simulations (IREMOS), vol. 3, No. 5, 2010, pp. 1002-1009.

Jiang, Y., et al., "Single-sensor multi-channel maximum power point tracking controller for photovoltaic solar systems," IET Power Electronics, vol. 5, Issue 8, 2012, pp. 1581-1592.

Kerekes, T., et al., "An Optimization Method for Designing Large PV Plants," IEEE Journal of Photovoltaics, vol. 3, No. 2, 2013, pp. 814-822.

Li, Q., et al., "A Review of the Single Phase Photovoltaic Module Integrated Converter Topologies With Three Different DC Link Configurations," IEEE Transactions on Power Electronics, vol. 23, No. 3, 2008, pp. 1320-1333.

Liang, Z., et al., "A High-Efficiency PV Module-Integrated DC/DC Converter for PV Energy Harvest in FREEDM Systems," IEEE Transactions on Power Electronics, vol. 26, No. 3, 2011, pp. 897-909.

Manz, D., et al., "Enhanced Reliability of Photovoltaic systems with Energy Storage and Controls," Subcontract Report, NREL/SR-581-42297: National Renewable Energy Laboratory, 2008, 57 pages.

Mazumdar, P., "Analysis and Design of Smart PV Module," A Thesis, Office of Graduate Studies of Texas A&M University, 2012, 86 pages.

Mei, Q., et al., "A Novel Improved Variable Step-Size Incremental-Resistance MPPT Method for PV Systems," IEEE Transactions on Industrial Electronics, vol. 58, No. 6, 2011, pp. 2427-2434.

Meinhardt, M., et al., "Past, Present and Future of grid connected Photovoltaic- and Hybrid-Power-Systems," IEEE, 2000, pp. 1283-1288.

Pilawa-Podgurski, R.C.N., et al., "Submodule Integrated Distributed Maximum Power Point Tracking for Solar Photovoltaic Applications," IEEE Energy Conversion Congress and Exposition, 2012, pp. 4776-4783.

Poshtkouhi, S., et al., "Multi-input Single-inductor DC-DC Converter for MPPT in Parallel-Connected Photovoltaic Applications," IEEE, 2011, pp. 41-47.

Sahan, B., et al., "A Single-Stage PV Module Integrated Converter Based on a Low-Power Current-Source Inverter," IEEE Transactions on Industrial Electronics, vol. 55, No. 7, 2008, pp. 2602-2609.

Thomsan, M., et al., "Impact of widespread photovoltaics generation on distribution systems," IET Renew. Power Gener., vol. 1, No. 1, 2007, pp. 33-40.

Yazdani, A., et al., "A Control Methodology and Characterization of Dynamics for a Photovoltaic (PV) System Interfaced With a Distribution Network," IEEE Transactions on Power Delivery, vol. 24, No. 3, 2009, pp. 1538-1551.

U.S. Appl. No. 13/063,015, filed Sep. 10, 2009.

International Preliminary Report on Patentability and Written Opinion, dated Mar. 15, 2011, received in connection with International Application No. PCT/US2009/056497.

(56) References Cited

OTHER PUBLICATIONS

International Search Report, dated Dec. 30, 2009, received in connection with International Application No. PCT/US2009/056497.

* cited by examiner

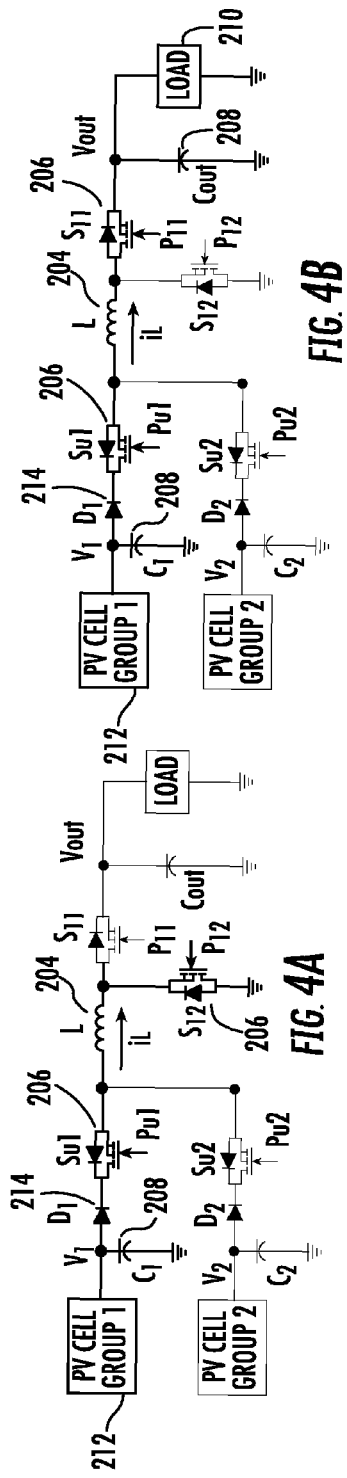
FIG. 4A
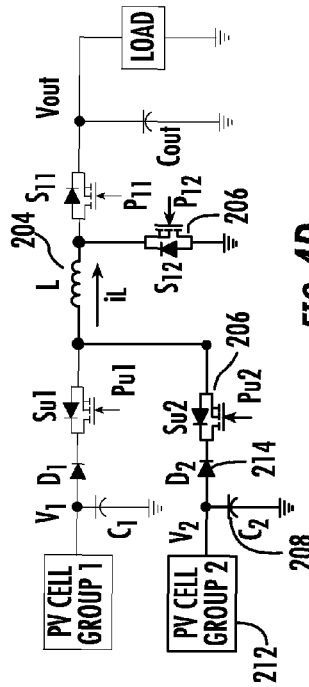
FIG. 4B
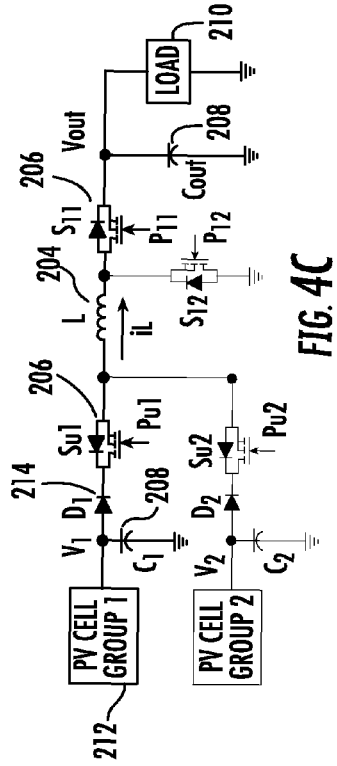
FIG. 4C
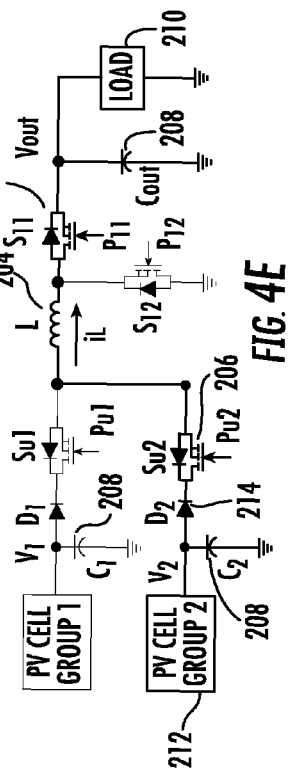
FIG. 4D
FIG. 4E

FIG. 6    Mode I

FIG. 7     Mode II

US 9,977,452 B2

MULTI-INPUT OR MULTI-OUTPUT ENERGY SYSTEM ARCHITECTURES AND CONTROL METHODS

CROSS-REFERENCE TO RELATED APPLICATION

This application claims benefit of and priority to U.S. Provisional Patent Application Ser. No. 61/949,285 filed on Mar. 7, 2014, which is fully incorporated by reference and made a part hereof.

BACKGROUND

The field of alternative energy is rapidly growing. With more population and growth comes increased demand on power systems, causing increased consumption of fossil fuels and traditional energy sources. Delivering these energy sources from their source to recipients comes at considerable cost since large amounts of electricity are lost during delivery. These drawbacks to traditional energy sources have lead to increased interest in alternative energy sources.

One form of alternative energy is solar power. Making solar power cost-effective and reliable are two keys to bringing this alternative energy to the forefront of modern power systems. The cost to build and install solar panel systems has continued to drop, but not at a rate that would make solar panels a primary choice of energy for residential and commercial buildings. Solar panels also suffer from inherent negative characteristics that reduce the power output of the overall system. For example, when one portion of a solar panel system becomes shaded from the sun, it can reduce the power output of the entire system, even from panels that remain in full view of the sun. This same problem presents itself within a single solar panel—even partial shading of a single panel will reduce the output of the portions of a panel remaining in full sunlight. As a result, solar panel systems continue to be expensive and to provide an amount of power output that may fall short of fulfilling the power demands for a particular building or structure.

Common low-cost photovoltaic (PV) solar systems may utilize a centralized architecture, as illustrated in FIG. 1A. The output characteristic curve of the PV solar panel 102 or cell has a unique maximum power point (MPP) where the output power from PV panel 102 or cell is largest. Maximum Power Point Tracking (MPPT) controllers 104 may be used to ensure that PV solar panels 102 operate under their highest or close to highest power level under varying weather conditions. In this architecture, a single centralized power converter 106 with maximum power point tracking (MPPT) controller may be utilized to supply power to an off-grid or grid-connected load 108. Large numbers of PV panels 102 may be connected in series and in parallel to generate high voltage and high power/current. This type of centralized architecture finds its applications in PV solar power plants and in residential rooftop PV systems. The total output voltage ($V_{pv}$) and the total output current ($I_{pv}$) from the grouped PV panels are usually sensed to perform MPPT control. However, the disadvantage of the centralized architecture is that if the operating conditions of one or several panels are mismatched or subjected to partial shading conditions, the MPPT controller 104 is not able to guarantee the maximum power point of each panel, resulting in low maximum power point tracking efficiency. Due to the effects of mismatching conditions, instead of performing MPPT with one central power converter, a so called "string system" architecture, as illustrated in FIG. 1B, may be used.

PV panels 102 are grouped into PV strings (several panels connected in series) and each PV string is connected to a power converter 110 which performs MPPT control for each individual string. The string voltage ($V_{st}$) and string current ($I_{st}$) from each PV panel string are usually sensed to perform MPPT control. The advantage of the string system architecture is that string converters perform MPPT at the string level. Therefore, the MPP tracking efficiency is higher than the centralized architecture under mismatching conditions between the strings. However, the string architecture solution still has significant amount of power losses under mismatching conditions within the same string. The reason is that, commonly, when PV panels 102 are connected into a string, a bypass diode can be placed in parallel with each PV panel. If a PV panel is shaded, this panel is bypassed in order to maintain the current level of the unshaded PV panels on the same string. Therefore, when PV panels operate under mismatching conditions, the power of the bypassed PV panels 102 is lost. If no bypass diodes are used across each panel, one shaded panel in a string will lead to significant power loss in that string because the shaded panel will limit the current in the string because of the in series connection.

To further improve the MPP tracking efficiency of the PV solar system under mismatched conditions and partial shading conditions, a module integrated converter (MIC) 112 PV solar system architecture may be used where each panel or group of cells has its own power converter and MPPT controller 104. FIG. 1C illustrates the parallel MIC PV solar system architecture and FIG. 1D illustrates the series MIC PV solar system architecture. The MIC architecture may allow MPPT to be performed for each individual PV panel, which alleviates the mismatching and partial shading conditions effects and therefore the MPP tracking efficiency is improved. In both series MIC architecture and parallel MIC architecture, the MPPT controller 104 requires sensing each PV panel's voltage ($V_{pv1}$, $V_{pv2}$, ... $V_{pvi}$) and current ($I_{pv1}$, $I_{pv2}$, ..., $I_{pvi}$) in order to perform distributed maximum power point tracking (DMPPT) for each individual PV panel. The tracking efficiency of this PV solar system architecture is higher than string and centralized PV solar system architectures. However, for an N-panel PV system, the number of required MPPT digital controllers 104 is N, the number of required analog-to-digital converter circuits is 2N and the number of required power converters is N, which results in significant cost increase.

Accordingly, despite multiple attempts to reduce the complexity of solar systems while increasing power output, significant drawbacks remain to existing systems. Another form of energy sources includes radio-frequency (RF) energy harvesting. RF waves are prevalent in modern technology and carry radio signals, cell phone signals, and television channels. These RF waves also provide a source of energy that can be converted to electricity.

With both of these and other forms of alternative energy sources, battery technology plays a central role in storing the energy until it is needed. Battery packs are made from individual cells that are electrically connected together. When one cell experiences problems, it degrades the performance of other cells also. In some systems, the performance of an entire battery pack may be limited to the performance of the worst cell. This means that when one cell goes bad, the entire battery pack becomes unusable. Cells are particularly likely to go bad where they are frequently charged and discharged, which happens often when batteries are used in alternative energy harvesting systems.

Taken together, there is a need for multiple improvements to modern energy harvesting systems. Solar panels can be reduced in cost, and complexity, while at the same time offering higher energy output. RF energy harvesting systems likewise can be made more efficient, and at reduced costs. And having better control over battery cells so that battery packs can continue in use even in the presence of isolated cell failures will aid with efficiently storing and dispensing stored energy.

SUMMARY

Systems and methods for efficiently controlling alternative energy sources are disclosed. In one example, a system for storing energy may include a plurality of cells that store energy and a plurality of power switches coupled to the cells. The system may also include an inductor coupled to the power switches and a controller coupled to the inductor, wherein the controller controls the power switches to transfer the energy to a load.

Disclosed herein are systems for processing or storing energy. One embodiment of the systems can comprise a plurality of cells that provide energy; a plurality of power switches coupled to the cells; an inductor coupled to the power switches; and a controller, wherein the controller controls the power switches to transfer the energy to a load. In one aspect, the controller can have multiple inputs. In one aspect, the system can further comprise a sensor. The controller can sense current, voltage and/or power output for a first group of the cells and adjust the duration that the power switch coupled to the first group of cells remains open. In one aspect, the cells can be solar panel cells. In one aspect, the system can comprise a plurality of cells which includes solar panel cells, and the power switches can be coupled to solar panels. In another aspect, the cells of the system can be battery cells. In one aspect, the system can further include a transceiver for recovering RF energy, magnetic energy, or other types of wireless energy. In one aspect, at least one of the plurality of cells of the system can be replaced with a second load and the load can be replaced with a cell that provides energy such that the controller controls the power switches to transfer the energy from the cell that provides energy to the second load.

Also disclosed herein are methods for processing or storing energy. One embodiment of the methods can comprise storing energy into a plurality of cells; and controlling, using a plurality of power switches coupled to the cells and an inductor coupled to the power switches, transfer of energy from the cells to a load. In one aspect, the method can further include sensing the power output for a first group of the cells; and adjusting a duration that the power switch coupled to the first group of cells remains open. In one aspect, the cells can be solar panel cells. In one aspect, the plurality of cells can include solar panel cells, and the power switches are coupled to solar panels, each of the solar panels including solar panel cells. In another aspect, the cells can be battery cells. In one aspect, the method can further comprise recovering RF energy, magnetic energy or other form of wireless energy; and storing the RF energy in at least one of the cells. In one aspect, the system can further include replacing at least one of the plurality of cells with a second load and replacing the load with a cell that provides energy such that the controller controls the power switches to transfer the energy from the cell that provides energy to the second load.

Further disclosed herein are computer-readable mediums comprising instructions which, when executed by a processor, perform methods for processing and storing energy. In one aspect, the methods can comprise storing energy into a plurality of cells; and controlling, using a plurality of power switches coupled to the cells and an inductor coupled to the power switches, transfer of energy from the cells to a load. In one aspect, the computer-readable medium can further include instructions that sense the power output for a first group of the cells; and adjust a duration that the power switch coupled to the first group of cells remains open. In one aspect, the cells can be solar panel cells. In one aspect, the plurality of cells can include solar panel cells, and the power switches are coupled to solar panels, each of the solar panels including solar panel cells. In another aspect, the cells can be battery cells. In one aspect, the computer-readable medium can further include instructions which, when executed by the processor recover RF energy or other form of wireless energy; and store the RF energy in at least one of the cells. In yet another aspect, the computer-readable medium can further including instructions which, when executed by the processor cause the controller to control the power switches to transfer the energy from a cell that provides energy to a second load when at least one of the plurality of cells is replaced with the second load the load is replaced with the cell that provides energy.

Additional advantages will be set forth in part in the description which follows or may be learned by practice. The advantages will be realized and attained by means of the elements and combinations particularly pointed out in the appended claims. It is to be understood that both the foregoing general description and the following detailed description are exemplary and explanatory only and are not restrictive, as claimed.

BRIEF DESCRIPTION OF THE DRAWINGS

The accompanying drawings, which are incorporated in and constitute a part of this specification, illustrate embodiments and together with the description, serve to explain the principles of the methods and systems:

FIGS. 4A-4E illustrate state diagrams during operation of the system.

DESCRIPTION

Figure 1A:
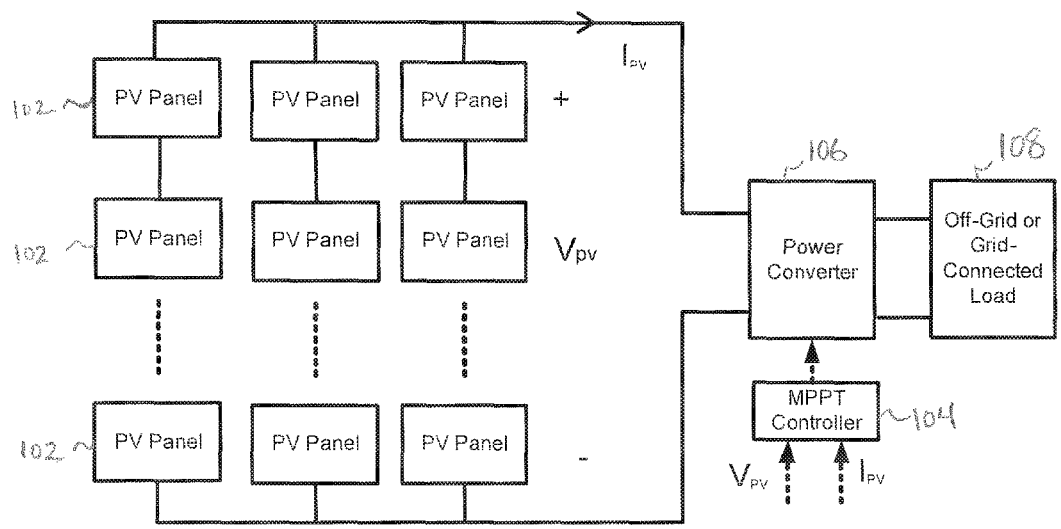
FIGS. 1A-D illustrate a first, second, third, and fourth solar power system, respectively.
Figure 1B:
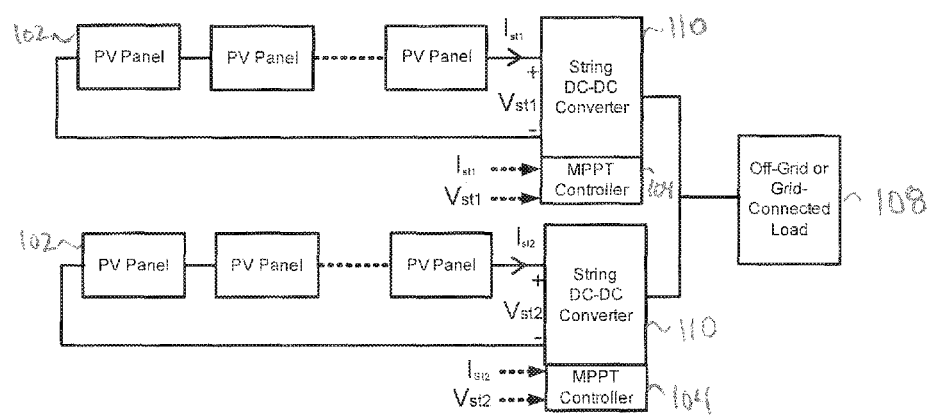
Figure 1C:
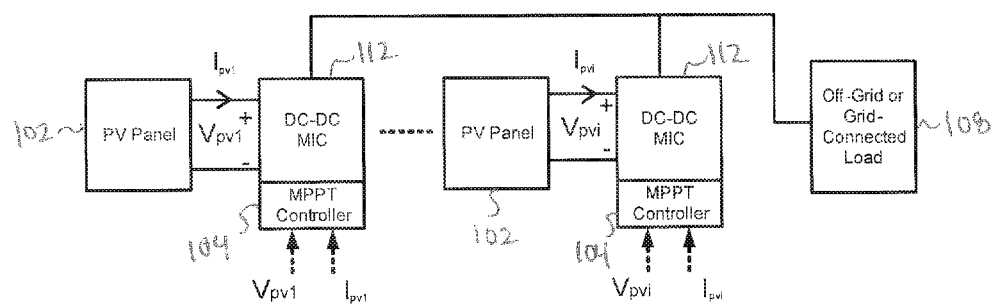
Figure 1D:
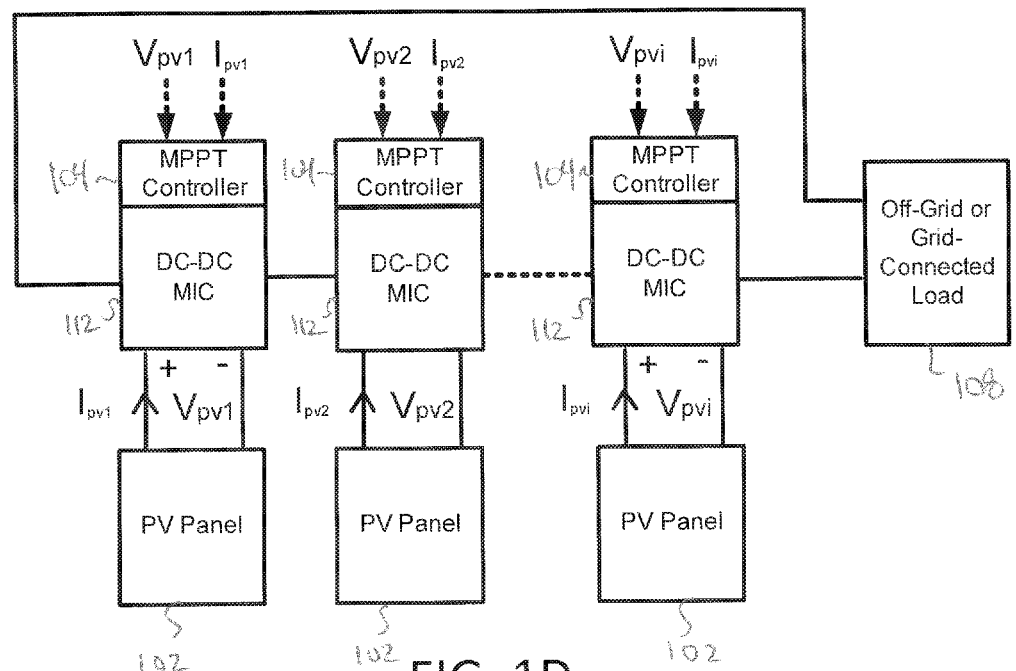

Before the present methods and systems are disclosed and described, it is to be understood that the methods and systems are not limited to specific synthetic methods, specific components, or to particular compositions. It is also to be understood that the terminology used herein is for the purpose of describing particular embodiments only and is not intended to be limiting.

As used in the specification and the appended claims, the singular forms "a," "an" and "the" include plural referents unless the context clearly dictates otherwise. Ranges may be expressed herein as from "about" one particular value, and/or to "about" another particular value. When such a range is expressed, another embodiment includes—from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint.

"Optional" or "optionally" means that the subsequently described event or circumstance may or may not occur, and that the description includes instances where said event or circumstance occurs and instances where it does not.

Throughout the description and claims of this specification, the word "comprise" and variations of the word, such as "comprising" and "comprises," means "including but not limited to," and is not intended to exclude, for example, other additives, components, integers or steps. "Exemplary" means "an example of" and is not intended to convey an indication of a preferred or ideal embodiment. "Such as" is not used in a restrictive sense, but for explanatory purposes.

Disclosed are components that can be used to perform the disclosed methods and systems. These and other components are disclosed herein, and it is understood that when combinations, subsets, interactions, groups, etc. of these components are disclosed that while specific reference of each various individual and collective combinations and permutation of these may not be explicitly disclosed, each is specifically contemplated and described herein, for all methods and systems. This applies to all aspects of this application including, but not limited to, steps in disclosed methods. Thus, if there are a variety of additional steps that can be performed it is understood that each of these additional steps can be performed with any specific embodiment or combination of embodiments of the disclosed methods.

The present methods and systems may be understood more readily by reference to the following detailed description of preferred embodiments and the Examples included therein and to the Figures and their previous and following description.

The disclosed systems and methods provide a distributed energy system architecture with a single-power-inductor, single-power-converter and single Maximum Power Point Tracking (MPPT) controller that may use one sensor for monitoring voltages and currents. This architecture may perform MPPT for a multichannel distributed energy system at panel-level, cells-group-level and/or single-cell-level under mismatching and partial shading conditions. The single power stage may be a multiple-input single-inductor (MISI) boost power converter which operates in Continuous Conduction Mode (CCM), but under certain conditions can also operate in Discontinuous Conduction Mode (DCM). This targets the high-cost and high-complexity issues of solar systems, which affect their practicality in many applications.

Figure 2A:
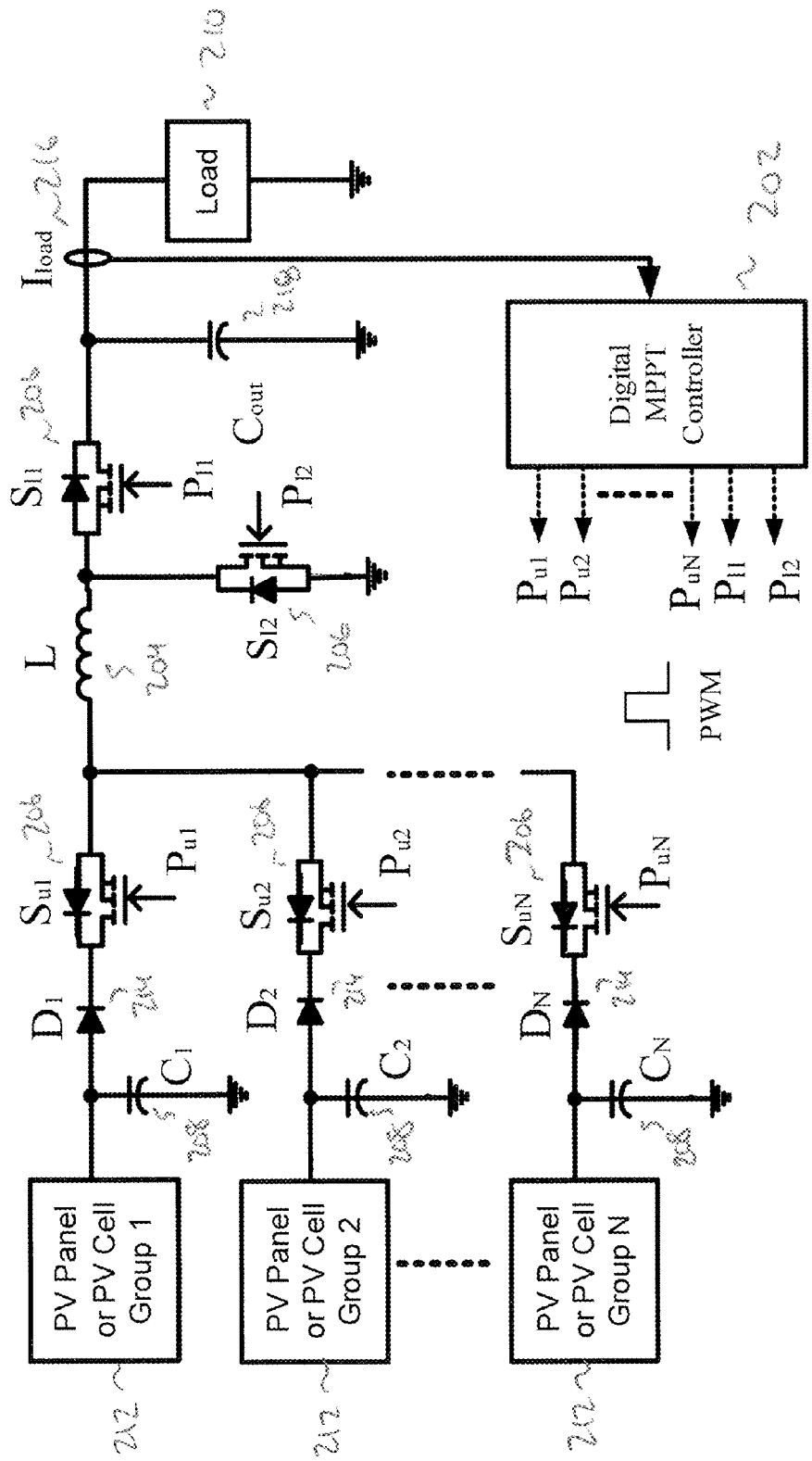
FIG. 2A illustrates a first embodiment of a control system.

FIG. 2A illustrates an exemplary SPC-SC-SS-MPPT architecture. Although FIG. 2A will be described by focusing on using the proposed architecture at the grouped-cells-level, it will be appreciated that this architecture may also be applied to the panel level, which means that each cell group may be connected to the MISI power converter through a power switch. For a photovoltaic (PV) system with N PV cell groups, by using the MISI power converter topology along with single MPPT controller 202 with single sensor located at 216, a total of only one power inductor 204, (N+2) power switches 206, (N+1) capacitors 208, one ADC (not shown) and one MPPT digital controller 202 may be used. With fewer components, the size, cost and power losses are reduced. The single-sensor 216 MPPT technique may allow the MISI power converter to track the MPPs of multiple cell groups under mismatching and partial shading conditions by using only load current information, assuming the load 210 is a battery load or resistive load. Similarly, if the load 210 is current-type load (e.g. current source inverter), the load voltage can be used for MPPT. Further, digital MPPT controller 202 may sense current or voltage instead of or in addition to sensor 216. Although not illustrated, an analog-to-digital (ADC) converter may be part of digital MPPT controller 202, or between sensor 216 and digital MPPT controller 202.

Figure 3:
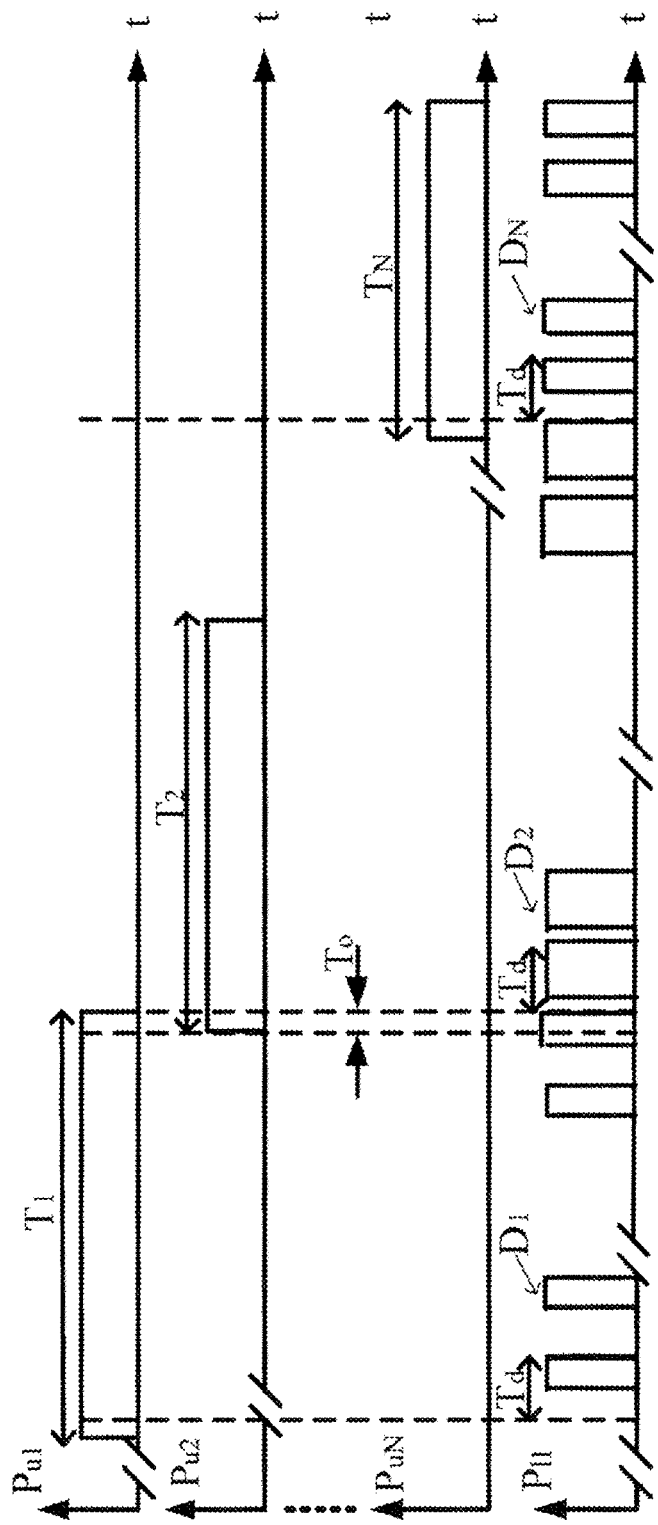
FIG. 3 illustrates a first timing diagram consistent with operation of the system.

As illustrated in FIG. 2A, PV cell groups or panels 212 may be connected to the MISI power converter through power switches 206 ($S_{u1}$, $S_{u2}$, . . . , $S_{uN}$). The power converter may be a combination of power switches 206, inductor 204, capacitor 218, and power switch S11, providing a multiple-input, single-output power converter. The power switches $S_{u1}$ to $S_{uN}$ (206) are turned ON and OFF sequentially based on the driving signals ($P_{u1}, P_{u2}, \ldots, P_{uN}$), as illustrated in FIG. 3 ($T_1=T_2= \ldots =T_N=103$ μs in this exemplary embodiment, including 3 μs overlapping time, although other durations may be used). Having this overlapping time helps in maintaining CCM operation during the transition between Su1 and Su2 but in another example there could be no overlapping time and instead dead-time (both switches are turned off during transition) which might result in operating in DCM during the transition period. Fast recovery diodes $D_1, D_2 \ldots D_N$ (214) may be placed before the power MOSFETs 206 ($S_{u1}, S_{u2}, \ldots, S_{uN}$) to prevent the conduction of MOSFET body diodes under the condition when the voltage at the source of the MOSFET is higher than voltage at the drain of the MOSFET. Two power MOSFETs 206 $S_{11}$ and $S_{12}$ are controlled by the driving signal $P_{11}$ and $P_{12}$ (with a frequency of 100 kHz in this example resulting in $T_d$=10 us). Because power switches 206 $S_{11}$ and $S_{12}$ are driven ON and OFF complimentarily, only the driving signal $P_{11}$ of $S_{11}$ is shown in FIG. 3. In FIG. 3, when power switch 206 $S_{ui}$ is switched ON, the duty cycle value of $P_{11}$ is $D_i$ (where i=1, . . . , N and N is the number of inputs). Capacitor 218 may provide temporary energy storage to stabilize the load while power switch 206 S11 turns off and on.

Figure 2B:
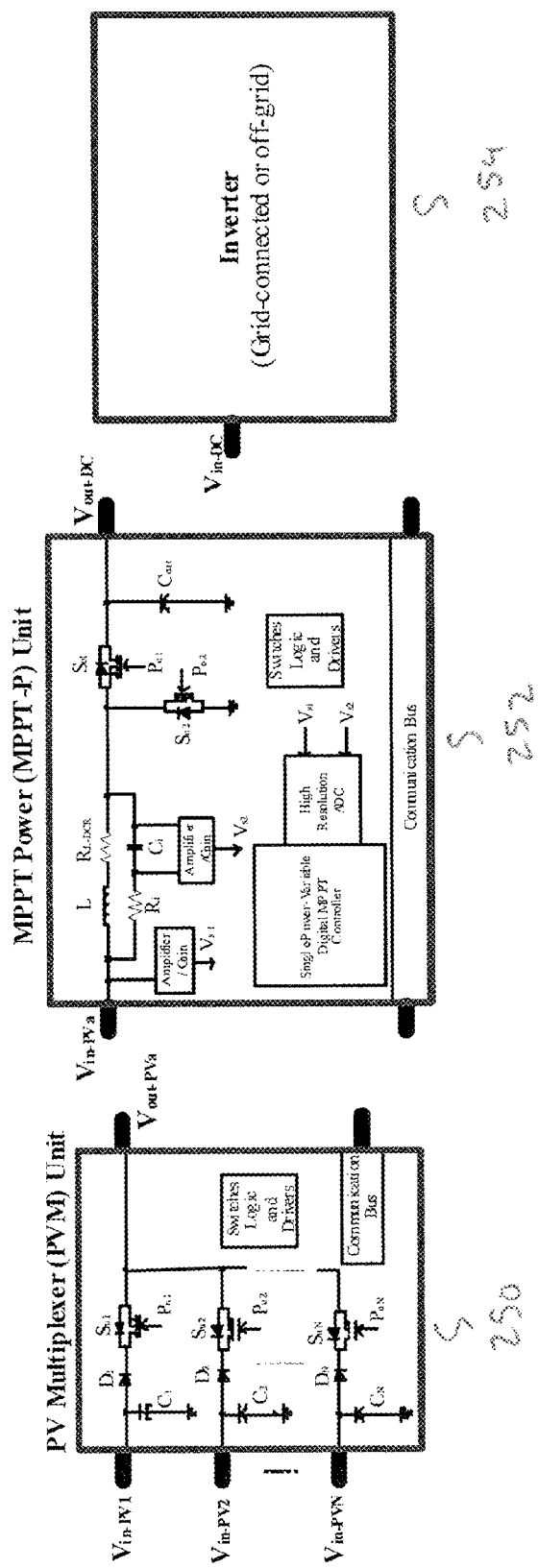
FIG. 2B illustrates a second embodiment of a control system.

FIG. 2B illustrates an illustration diagram of another architecture. A relatively simple and low-cost PV Multiplexing Unit 250 (PVM unit), for example, one with no voltage or current sensing for MPPT control, may be used to realize a multi-input single-output circuit. Each input to the PVM unit 250 may be from a PV panel 212 and the single output may be connected to an MPPT Power Unit 252 (MPPT-P unit), which may include a DC-DC boost converter. The MPPT-P unit 252 may have only one MPPT controller that senses one power value (by sensing only one voltage and one current) and uses it to track the individual MPP of each individual solar panel. The switches inside the PVM unit may have fixed and equal ON/OFF times that are not varied to perform MPPT which makes its design simpler and highly efficient by not requiring MPPT or other closed-loop control. Each PV panel's MPP may also be tracked by varying the duty cycle (ON/OFF times) of the active switch $S_{o2}$ in the PVM unit (switch $S_{o1}$ control/drive signal is complementary to the control signal of switch $S_{o2}$). The output DC voltage of the MPPT-P unit may then be supplied to an inverter 254 which can handle grid-connection or off-grid operation.

The MPPT multi-mode controller 202 may utilize only one total power value (and not each PV panel power value) in order to perform highly efficient and accurate MPPT function. As will be described in more detail below, the algorithm may have two modes of operation. One mode may be used for fast tracking of the MPP points by adjusting the MPPT duty cycle values for each PV panel by the same amount under fast irradiance changes. Another mode may adjust the individual duty cycle for each PV panel in order to lock an accurate MPP point for each PV panel. There may be two candidate methods to measure the one power that is needed by the MPPT multi-mode controller. One of them is by directly measuring the voltage by using a voltage sensor and the current by using a current sensor. Another method may further reduce cost by not requiring a current sensor and instead using what is called power inductor's DCR sensing method. This method may utilize a simple circuit that obtains the current information by integrating the voltage across the power inductor, which may eliminate the power loss caused by adding resistive current sensing and also reduce cost.

Figure 5:
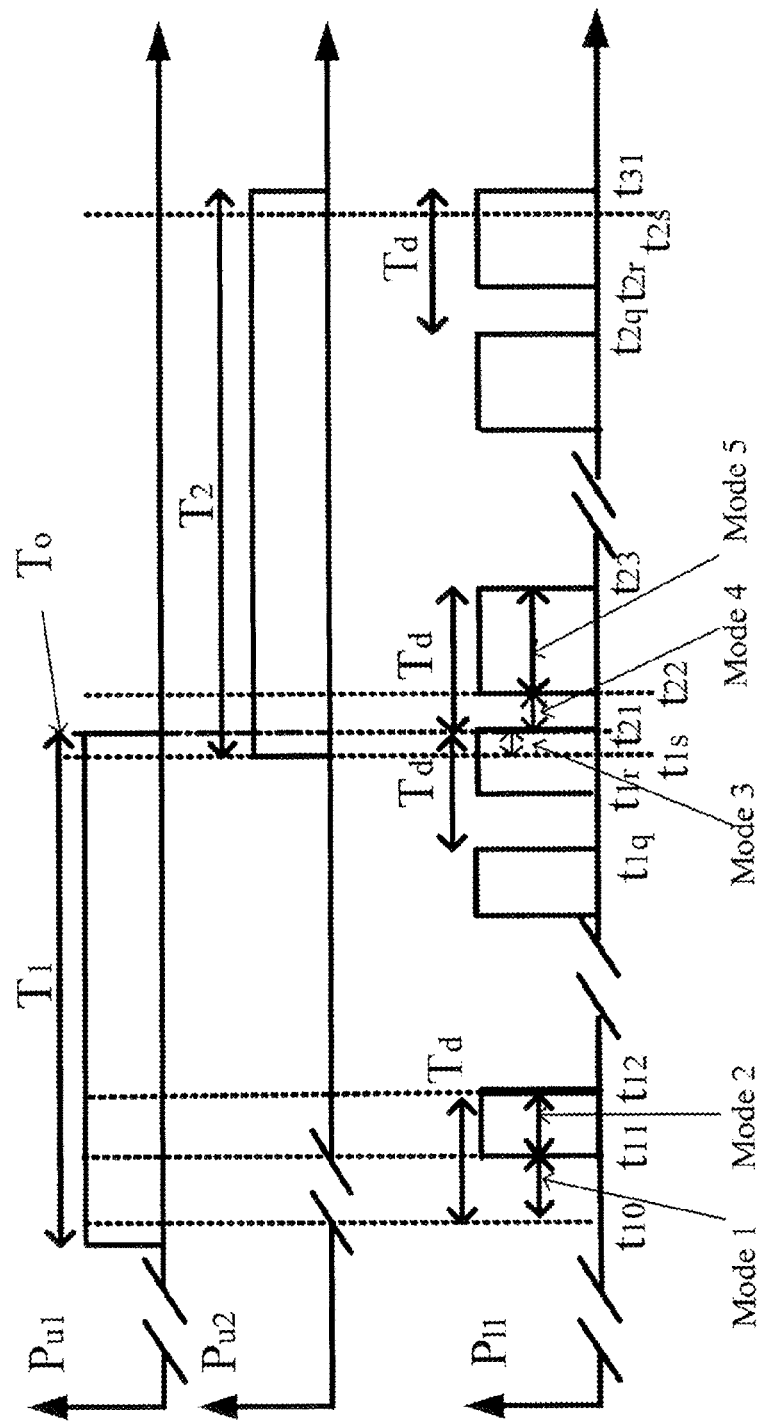
FIG. 5 illustrates a second timing diagram consistent with operation of the system.

The equivalent circuits for the main modes of operations are illustrated in FIGS. 4A-E and the timing for each operation mode is illustrated in FIG. 5. In order to keep the inductor 204 of the power converter operating in continuous conduction mode (CCM), there may be a 3 μs overlapping time (e.g. To=3 μs) between the driving signals of the input switches. The behavior of the MOSFETs during the 3 μs its overlapping time will be explained below.

FIG. 4A illustrates mode 1 ($t_{10}$~$t_{11}$): In this mode, the power switches 206 $S_{u1}$ and $S_{12}$ are turned ON and $S_{11}$ is turned OFF. PV Cell Group-1 supplies voltage $V_1$ at the input which charges the inductor 204 and causes its current to ramp up. Assume that the output voltage is $V_{out}$ and the change in the inductor current is $\Delta i_L$, Eq. (1) gives the relationship between the input voltage, the output voltage and the charging time.

$$\Delta i_L/(t_{11}-t_{10})=V_1/L \qquad (1)$$

FIG. 4B illustrates mode 2 ($t_{11}$~$t_{12}$): In this mode, the power switch 206 $S_{u1}$ and $S_{11}$ are turned ON and $S_{12}$ is turned OFF. PV Cell Group-1 supplies voltage $V_1$ at the input. In this mode the inductor discharges and its current ramps down based on Eq. (2).

$$\Delta i_L/(t_{12}-t_{11})=-(V_1-V_{out})/L \qquad (2)$$

Mode 1 and Mode 2 repeat for N switching cycles (10 cycles in one exemplary embodiment) during $T_1$ when power switch 206 $S_{u1}$ is ON. In FIG. 5, the time from $t_{10}$ to $t_{12}$ ($t_{12}-t_{10}=T_d$) is the first ON and OFF cycle of switch $S_{11}$. If there are N cycles of $T_d$ in $T_1$, in the $N_{th}$ cycle, variables q=N−1, r=N and s=N+1. The MPPT control for PV Cell 212 Group-1 can be performed by perturbing the duty cycle ($D_1$) of power switch 206 $S_{11}$ during $T_1$, where $D_1=(t_{12}-t_{11})/T_d$.

At the time $t_{1q}$, the power converter is still operating in Mode 1 of FIG. 4A when power switch 206 $S_{11}$ enters the OFF state. The $t_{1r}$ represents the start of Mode 2 in FIG. 4B, when power switch 206 $S_{11}$ enters the ON state again. The time $t_{1s}$ represents the time when the power converter enters Mode 3, shown in FIG. 4C.

FIG. 4C illustrates Mode 3 ($t_{1s}$~$t_{21}$): In this mode, the driving signals of the two power switches 206 $S_{u1}$ and $S_{u2}$ overlap for duration $T_o$. However, only the power switch 206 connected to a higher voltage PV input will turn ON. For instance, if $V_1 > V_2$, then power switch 206 $S_{u1}$ is turned ON as shown in FIG. 5. The power switch 206 $S_{u2}$ does not turn ON because the voltage at the source of the MOSFET is larger than the voltage at drain of the MOSFET. In this mode, the inductor 204 continues to discharge based on Eq. (3):

$$\Delta i_L/(t_L(t_{21}-t_{1s})=-(V_1-V_{out})/L \qquad (3)$$

FIG. 4D illustrates Mode 4 ($t_{21}$~$t_{22}$): In this mode, the power switches 206 $S_{u2}$, $S_{12}$ are turned ON and $S_{11}$ is turned OFF. PV Cell 212 Group-2 supplies voltage $V_2$ at the input which charges the inductor 204 and causes its current to ramp up. Eq. (4) gives the relationship between input voltage and charging time.

$$\Delta i_L/(t_{22}-t_{21})=V_2/L \qquad (4)$$

FIG. 4E illustrates Mode 5 ($t_{22}$~$t_{23}$): In this mode, the power switches 206 $S_{u2}$ and $S_{11}$ are turned ON and $S_{12}$ is turned OFF. PV Cell 212 Group-2 supplies voltage $V_2$ at the input. In this mode, the inductor 204 discharges and its current ramps down based on Eq. (5).

$$\Delta i_L/(t_{23}-t_{22})=-(V_2-V_{out})/L \qquad (5)$$

Mode 4 and Mode 5 repeat for N switching cycles (10 cycles in this exemplary embodiment) during $T_2$ when $S_{u2}$ is ON. The MPPT control for PV Cell 212 Group-2 can be performed by perturbing the duty cycle ($D_2$) of power switch 206 $S_{11}$ during $T_2$, where $D_2=(t_{23}-t_{22})/T_d$. Mode 3 repeats each time an input switch is to be turned ON and another is to be turned OFF in order to perform MPPT control for the next input. For N inputs, the five modes of operation keep repeating. Having different duty cycle values for power switch 206 $S_{11}$ during each input switch turn ON time period allows for MPPT control for each input independently.

The duty cycle Di, as discussed earlier in the modes of operation analysis may be defined as the ON time of switch $S_{11}$ (driven by signal $P_{11}$) divided by the duration of the switching cycle ($T_d$). $S_{11}$ and $S_{12}$ may be driven complementarily. In another embodiment, there may be no overlap time between the ON times of the input switches. For example, there could be no overlap time between the ON time of T1 (when Su1 is turned ON) and the ON time of T2 (when Su2 is turned ON). In this case, there is a duration of dead-time (all input switches Su1 through SuN are OFF during this no overlap time/dead-time). Further, the inductor current could be continuous or discontinuous. This is usually referred to as power converter with power inductor operation in Continuous Conduction Mode (CCM) or Discontinuous Conduction Mode (DCM).

Figure 6:
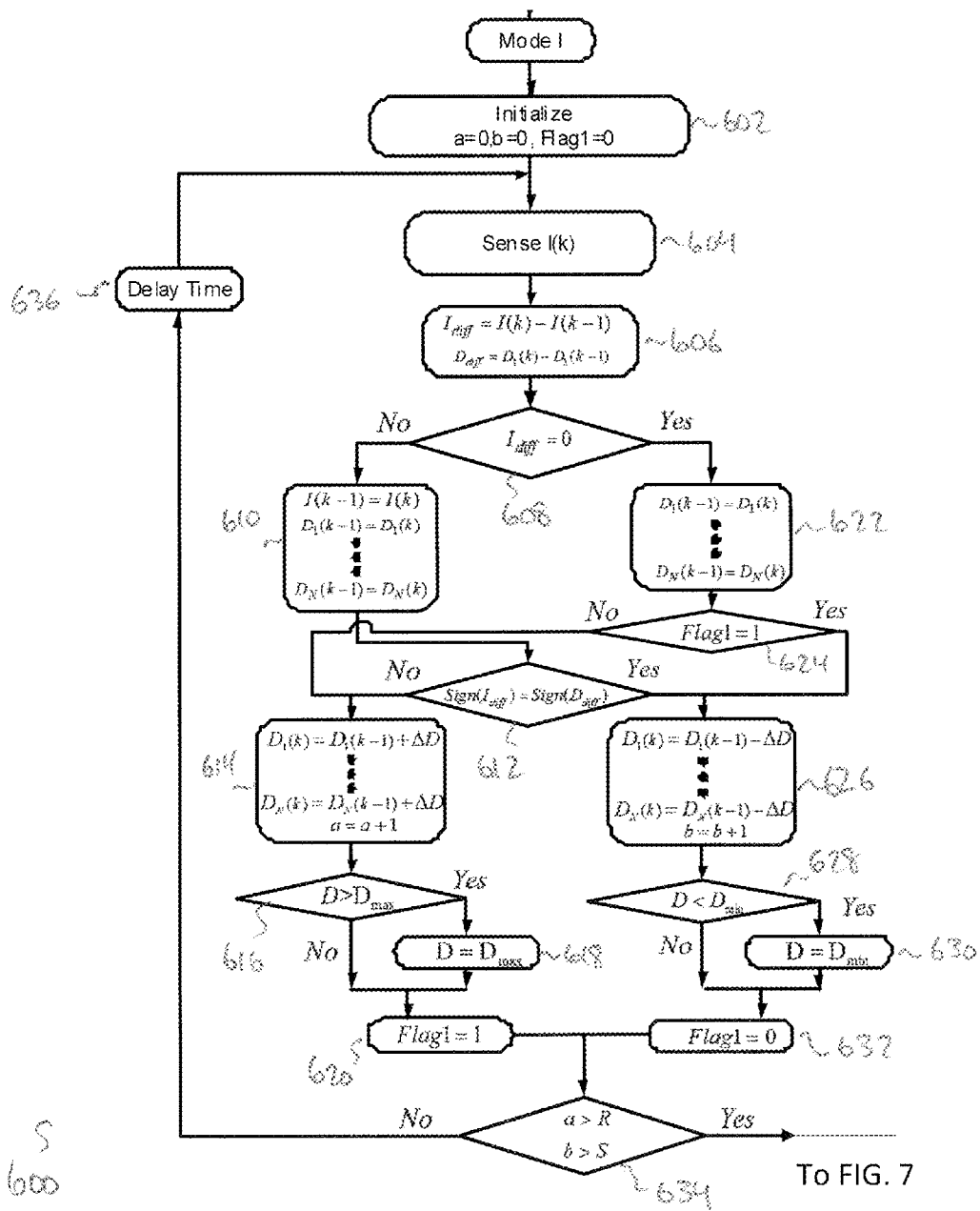
FIG. 6 illustrates a first flowchart of a method for operating the system.
Figure 7:
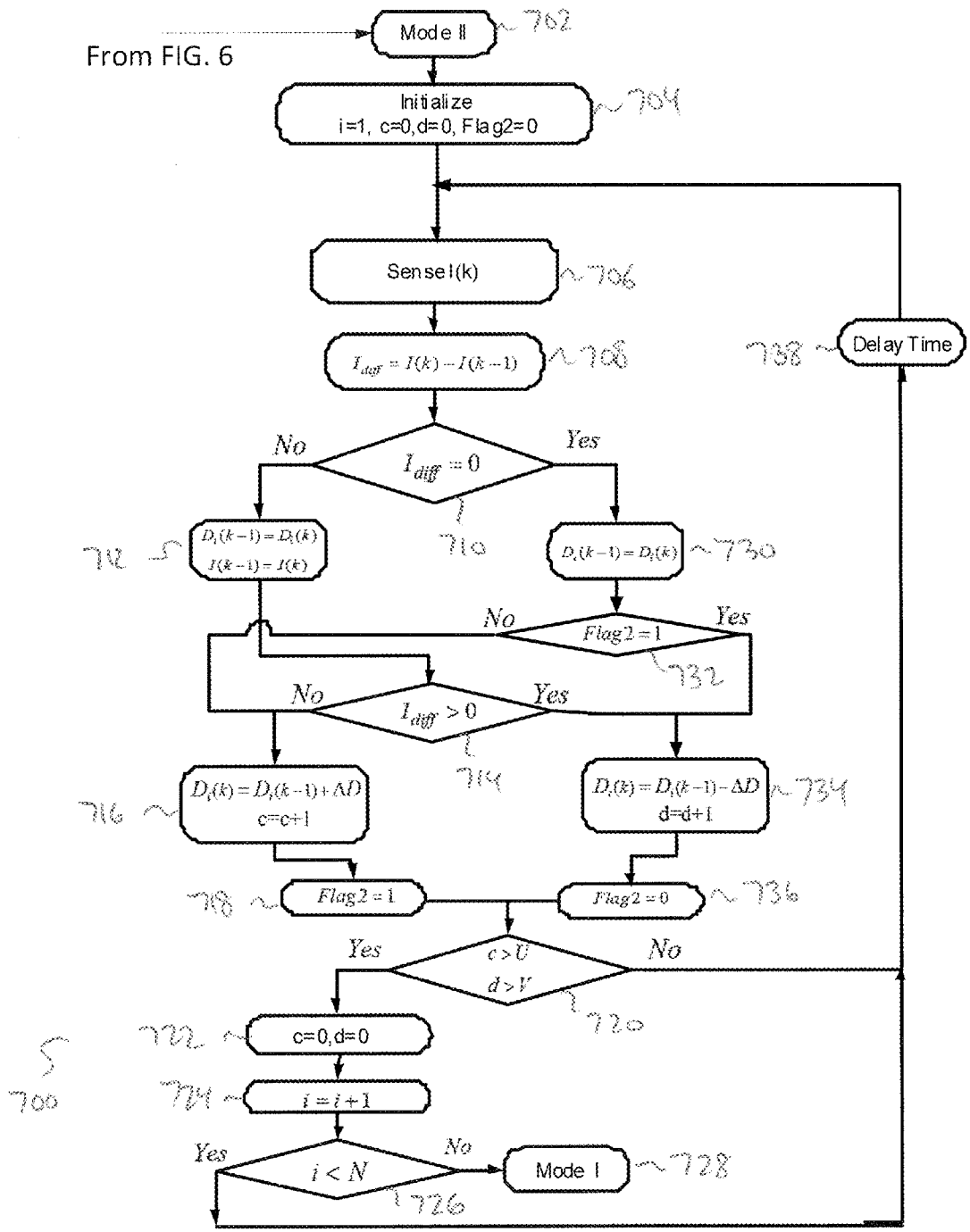
FIG. 7 illustrates a second flowchart of a method for operating the system.

FIGS. 6 and 7 illustrate an exemplary method to perform MPPT control for the MISI power converter topology. The following discusses the operation of the algorithm. By referring back to FIG. 2A, the power switches 206 $S_{u1}$, $S_{u2}$, ..., $S_{uN}$ may operate at fixed frequency and fixed ON time duration. Assume that when power switch 206 $S_{ui}$ is turned ON and the duty cycle of $P_{11}$ is $D_i$, then by tuning/adjusting/perturbing $D_1, D_2, \ldots, D_N$, each PV cell group 212 can achieve its own MPP.

The method for SS-MPPT control may have two operation modes. In the first mode, the algorithm may change $P_{11}$'s duty cycles ($D_1, D_2, \ldots, D_N$) in the same direction in order to track the maximum power points (MPPs) of all PV cell groups together, leading to a converge to a local maximum power point (MPP) of the system. In the second mode, the method may detect the required difference between the duty cycle values of $P_{11}$ in order to account for the differences between the PV cell groups 212 (e.g., when they are subjected to different irradiance levels or when they are mismatched). The controller 202 senses the load current of the system. When the algorithm starts, the duty cycles of Pu are set as $D_1, D_2, \ldots, D_N$.

In the first operation mode illustrated in FIG. 6, the controller adjusts/perturbs the duty cycles ($D_i$) in the same direction (all increment or all decrement) in order to converge to a maxima under the existing difference between the duty cycles (the difference between the duty cycles is kept unchanged in this operation mode). Various variables may be initialized at step 602. The load current value I(k) may be sensed (step 604) and compared at step 606 to its previous value I(k−1) from the previous algorithm iteration to yield the change in load current $I_{diff}$=I(k)−I(k−1). Similarly, the change in duty cycle $D_{diff}$=$D_1$(k)−$D_1$(k−1) may be obtained at step 606. At step 608, $I_{diff}$ may be checked to determine if is zero or not and no change has been detected. If $I_{diff}$ value is not zero, then value of current stored in the previous iteration may be replaced with new value at step 610, along with the duty cycle values.

If the sign of $I_{diff}$ and $D_{diff}$ are the same (step 612), the duty cycles may be incremented by ΔD (step 614) and the variable "Flag1" is set to "1" (step 620) in order for the algorithm to remember the last perturbation direction of the duty cycles. If the signs of $I_{diff}$ and $D_{diff}$ are opposite at step 612, the duty cycles may be decremented by ΔD and (step 626) "Flag1" is set to "0" (step 632) in order for the algorithm to remember the last perturbation direction of the duty cycles. As illustrated in FIG. 6, the value of "Flag1" may be used in the case when $I_{diff}$=0 (step 606 and step 608), which could happen because the ADC's resolution is not enough to see the change in the load voltage as a result of the last duty cycles perturbation. In this case, the duty cycles may be perturbed in the same direction as in the past iteration and the current values are not swapped and only duty cycle values are swapped (step 622). Next, a flag may be set to 1 in the case Idiff=0 at step 624. Flag 1 may be used at step 624 and step 620. This case is opposite to the earlier case when $I_{diff}$≠0 and in this case both the current values and duty cycle values are swapped (step 610). This step may be equivalent to increasing the duty cycles perturbation step size. For operation safety, the duty cycle values may be compared and limited to a minimum value ($D_{min}$) at step 628 and step 630 and a maximum value ($D_{max}$) at step 616 and step 618. The variable "a" may be incremented (step 614) each time the duty cycles are incremented (step 614) and the variable "b" may be incremented (step 626) each time the duty cycles are decremented (step 626). Once variables "a" and "b" are larger than selected threshold values R and S (e.g. R=4 and S=4) at step 634, the controller switches to the second mode of operation, show in FIG. 7 (step 702). At step 636, delay time may be used prior to repeating the process, which may take any value including zero.

FIG. 7 illustrates a second mode (step 702). In the method of FIG. 7, the SS-MPPT controller may perturb the duty cycle of $P_{11}$ sequentially in order to detect the needed difference between the input PV cells groups (steps 704 to 720, which are similar to steps 602 to 634 in the first mode except that in the second mode the procedure is done for one duty cycle only at a time that corresponds to one PV cells groups). The duty cycle of $P_{11}$ may be perturbed and passed to the first group of cells channel (when $S_{u1}$ is ON). The variable Flag2 in the second mode may serve a similar purpose as the variable Flag1 in the first mode. The variable c may be incremented (step 716) each time a positive duty cycle perturbation is generated (step 716) and the variable d may be incremented (step 734) each time a negative duty cycle perturbation is generated (step 734). Once the values of c and d are larger than a selected value U and V (e.g. U=4 and V=4) at step 720, the index variable "i" may be incremented by "1" (step 724) after resetting the values of c and d to zeroes (step 722), which moves the algorithm operation to perturb the next perturbation duty cycle. When the index variable "i" is equal to N (number of the PV cell groups in the system) at step 726, the algorithm switches from the second mode back to the first mode of FIG. 6 (step 728).

The steps in the flowcharts could be implemented using a digital circuit, microcontroller or computer, or using analog circuits. It could also be implemented by using a mixed digital-analog electric circuits designs.

Systems and methods as described herein operate under constant or varying loads, whether a battery/voltage type load or current load. In one exemplary embodiment, the MISI power converter of FIG. 2A may include a 100 uH inductor (L), four 220 μF capacitors ($C_1$, $C_2$, $C_3$ and $C_{out}$), five MOSFETs ($S_{u1}$, $S_{u2}$, $S_{u3}$, $S_{11}$ and $S_{12}$) and three diodes ($D_1$, $D_2$ and $D_3$). In this example, the parameters of the PV cell groups may be:

PV Cell Group-1: $V_{oc}$=11V, $V_{mp}$=10V, $I_{mp}$=1.2 A, $I_{sc}$=1.4 A.

(This represents 100% irradiance level of 1000 W/m$^2$)

PV Cell Group-2: $V_{oc}$=9.0V, $V_{mp}$=8.0V, $I_{mp}$=0.96A, $I_{sc}$=1.12 A.

(This represents 80% irradiance level of 800 W/m$^2$)

PV Cell Group-3: $V_{oc}$=5.5V, $V_{mp}$=5.0V, $I_{mp}$=0.6 A, $I_{sc}$=0.7 A.

(This represents 50% irradiance level of 500 W/m$^2$)

where $V_{oc}$ is the open circuit voltage of the PV cell group, $I_{sc}$ is the short circuit current of the PV cell group, $V_{mp}$ is the maximum power point voltage of the PV cell group and $I_{mp}$ is the maximum power point current of the PV cell group. Of course, other parameters may be used for different applications.

Figure 8:
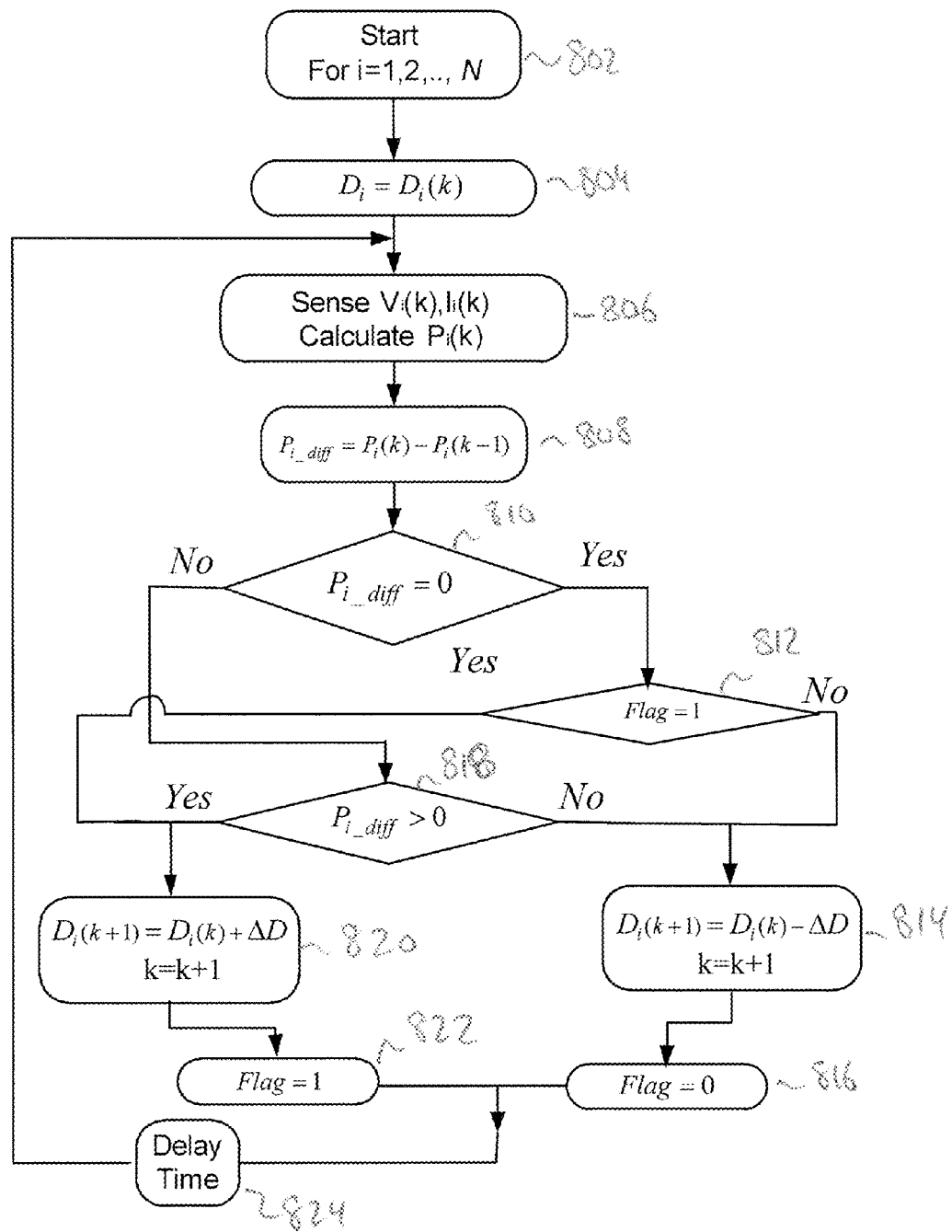
FIG. 8 illustrates a third flowchart of a method for operating the system.

FIG. 8 illustrates a simplified method. In FIG. 8, the operation principle may be that after power switch 206 Sup is turned ON, the corresponding duty cycle ($D_i$) of switch $P_{11}$ may be updated based on previous MPPT cycle's perturbation at steps 802 and 804. In a sequence, the voltage $V_i$(k) and current $I_i$(k) of each PV panel are sensed and the power value $P_i$(k) of each PV panel may be calculated at step 806. This power value $P_i$(k) for each PV solar input may be then compared to the previous power value stored from the previous MPPT cycle's perturbation $P_i(k-1)$ by calculating $P_{i\_diff}=P_i(k)-P_i(k-1)$ at step 808. Steps 808 through 818 are similar to those described in FIG. 6, except using the power differentials. The new duty cycle value $D_i(k+1)$ is calculated based on the equation $D_i(k+1)=D_i(k)\pm\Delta D$ (step 820 and step 814), where $\Delta D$ is the duty cycle perturbation. This process repeats until the operating point of each PV panel reaches the MPP. By using this approach, the MPPT controller may track the individual MPP of each input PV panel as if each input panel is connected to an individual power converter.

Accordingly, efficient power control may be achieved, allowing high power converter efficiency and increased power from cell groups and/or panel groups. Besides using a voltage-type load, the proposed architecture and MPPT control scheme can also be applied in PV system with current-type load. For PV system with current-type load, MPPT algorithms (illustrated in FIGS. 6-8) sense and maximize the load voltage instead of sensing and maximizing the load current.

A multichannel distributed PV system architecture with a single-power-inductor single-power-converter and single MPPT controller that may require only one sensor has been described. Each panel can be controlled separately from the other panels, avoiding the situation where the maximum power output is affected by a single panel being shaded. In this architecture, the input sources can be PV panels, PV cell groups or PV cells. The proposed architecture effectively reduces the component cost and system volume compared to MIC or sub-MIC PV solar system architectures. The proposed SPC-SC-SS-MPPT architecture yields high tracking efficiencies under mismatching conditions and transient conditions.

Figure 9:
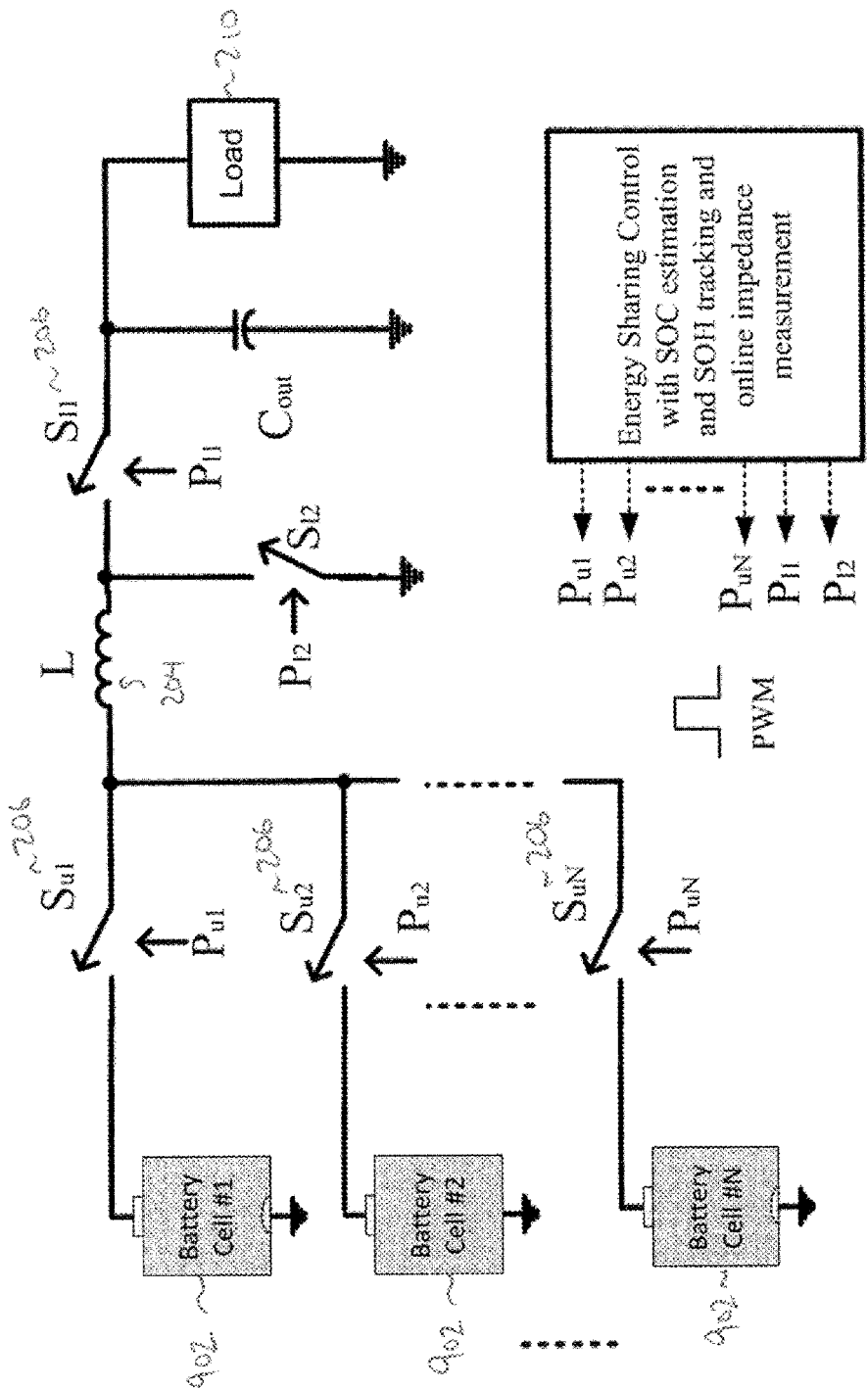
FIG. 9 illustrates a battery cell system.

In another embodiment, the power circuit with modified control described previously may also be used for battery energy storage systems, as shown in FIG. 9. Battery packs may be made up of individual cells 902 that are electrically connected together. When one cell deteriorates, it degrades the performance of other cells also, limiting performance of a battery to the cell with the worst performance. Energy flow for each cell cannot be controlled individually. However, by applying the system and methods described previously to battery systems, these drawbacks can be avoided. The description above with reference to FIG. 2A applies equally to like elements in FIG. 9, the exception being that battery cells are now connected to the system rather than solar panel cells.

Figure 12:
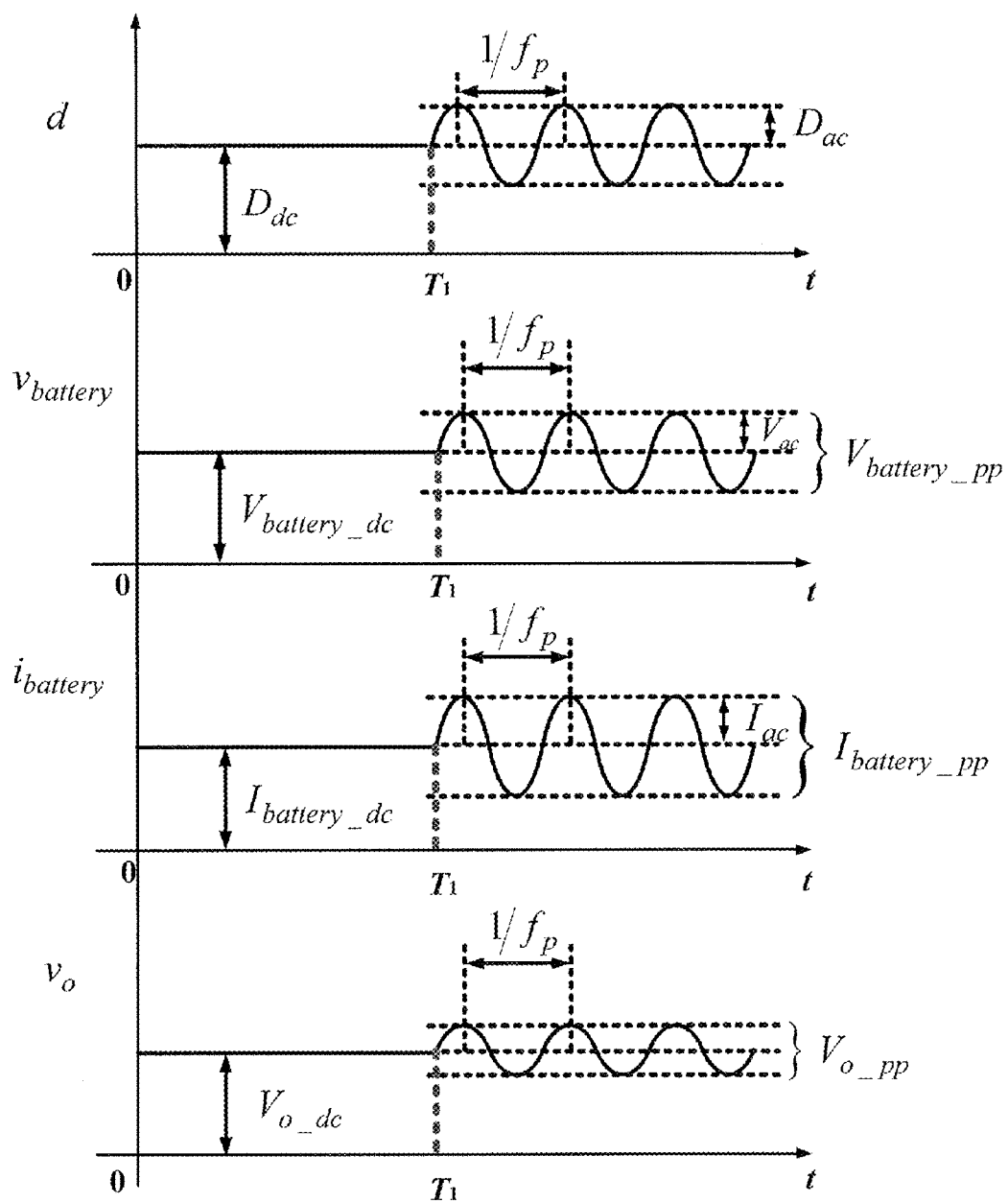
FIG. 12 illustrates exemplary waveforms consistent with battery embodiments.

FIG. 9 therefore illustrates a system where battery cells have energy sharing control, providing a state of charge balance through one power inductor and a power converter. Each cell's impedance may be measured in real-time for early fault detection. This allows efficient and low-cost control when discharging battery cells. In order to supply a desired output voltage ($V_{o\_dc}$) during the steady-state operation, the power converter may have a DC duty cycle value ($D_{dc}$) as illustrated in FIG. 12. In one aspect, the duty cycle of a switch can be modulated or perturbed to create varying voltage and current which can be used for impedance measurements and health evaluation of the inputs or outputs such as battery cells, solar cells, antennas, inductive coils and the like. The DC voltage of the battery and DC current of the battery are $V_{battery\_dc}$ and $I_{battery\_dc}$, respectively. Once the impedance measurement mode is triggered at $T_1$, a small duty cycle sinusoidal perturbation signal ($d_{ac}$) with a peak amplitude of $D_{ac}$ at the perturbation frequency ($f_p$) may be added to $D_{dc}$ as given by equation (8). This small duty cycle perturbation will result in generating relatively small sinusoidal ripples superimposed over the DC output voltage of the power converter ($V_{o\_dc}$), over the DC voltage of the battery ($V_{battery\_dc}$), and over the DC current of the battery ($I_{battery\_dc}$) as given by equations (9) and (10). In (9) and (10), $v_{battery}$ is the voltage of the battery and $i_{battery}$ is the current of the battery. All of these sinusoidal ripples are with the perturbation frequency of $f_p$. By measuring the peak-to-peak values (maximum-to-minimum values) of the battery voltage ($V_{battery\_pp}$) and the battery current ($I_{battery\_pp}$) during one perturbation cycle, the magnitude of the battery AC impedance at $f_p$ can be determined based on (11). If there is a phase shift between the voltage of the battery and the current of the battery and/or phase information is needed, the phase at $f_p$ can be determined by using (12), where $\varphi_v-\varphi_i$ is the phase shift between the voltage of the battery and the current of the battery. In the multi-input power converter shown in FIG. 9, in order to measure the impedance of battery cell #1 for example, the duty cycle of the switches S11 and S12 is modulated sinusoidal as in the figure below when switch Su1 is turned ON. Similarly the impedance can be measured for cell #2 when Su2 is turned ON by sinusoidally modulating the duty cycle of S11 and S12.

$$d(t)=D_{dc}+D_{ac}\cdot\sin(2\pi ft) \quad (8)$$

$$i_{battery}(t)=I_{battery\_dc}+I_{ac}\cdot\sin(2\pi ft+\varphi_i) \quad (9)$$

$$v_{battery}(t)=V_{battery\_dc}+V_{ac}\cdot\sin(2\pi ft+\varphi_v) \quad (10)$$

$$|z_{battery}(f)|=v_{battery-pp}/I_{battery-pp} \quad (11)$$

$$\angle z_{battery}(f)=\varphi_v-\varphi_i \quad (12)$$

The discharging and charging rate of each battery cell can also be controlled to achieve the desired or equal state-of-charge balancing between the cells by controlling the duty cycle of S11 and S12 when the input switches Su1, . . . SuN are tuned ON. For example, the duty cycle of S11 when Su1 is ON can be made larger than the duty cycle of S11 when Su2 is ON which results in discharging battery cell #1 at faster rate than cell #2 of both cells have the same internal impedance. In another embodiment, the discharge rate can be adjusted for each cell based on the internal impedance value measured in real-time, based on the temperature of each cell, and/or based on the health of each cell.

In discharge mode the battery cells are supplying power to the load and in the charge mode the battery cells are receiving energy from an energy source that is connected instead of the load (201 in FIG. 9 is in this case an energy source that supplies power). The battery cells can also be exchanging energy between each other (one charging form another).

Figure 10A:
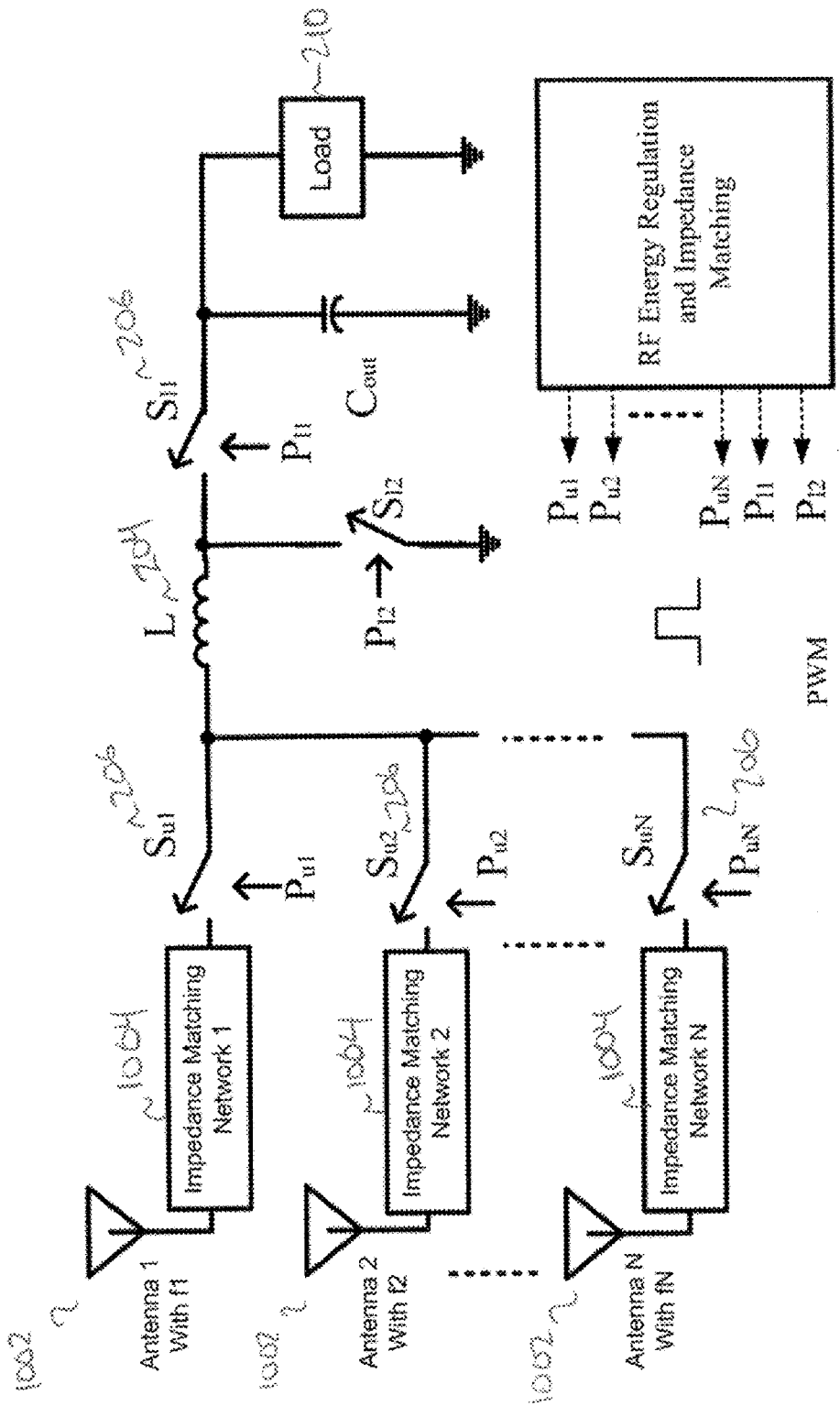
FIG. 10A illustrates a first RF energy harvesting system.
Figure 10B:
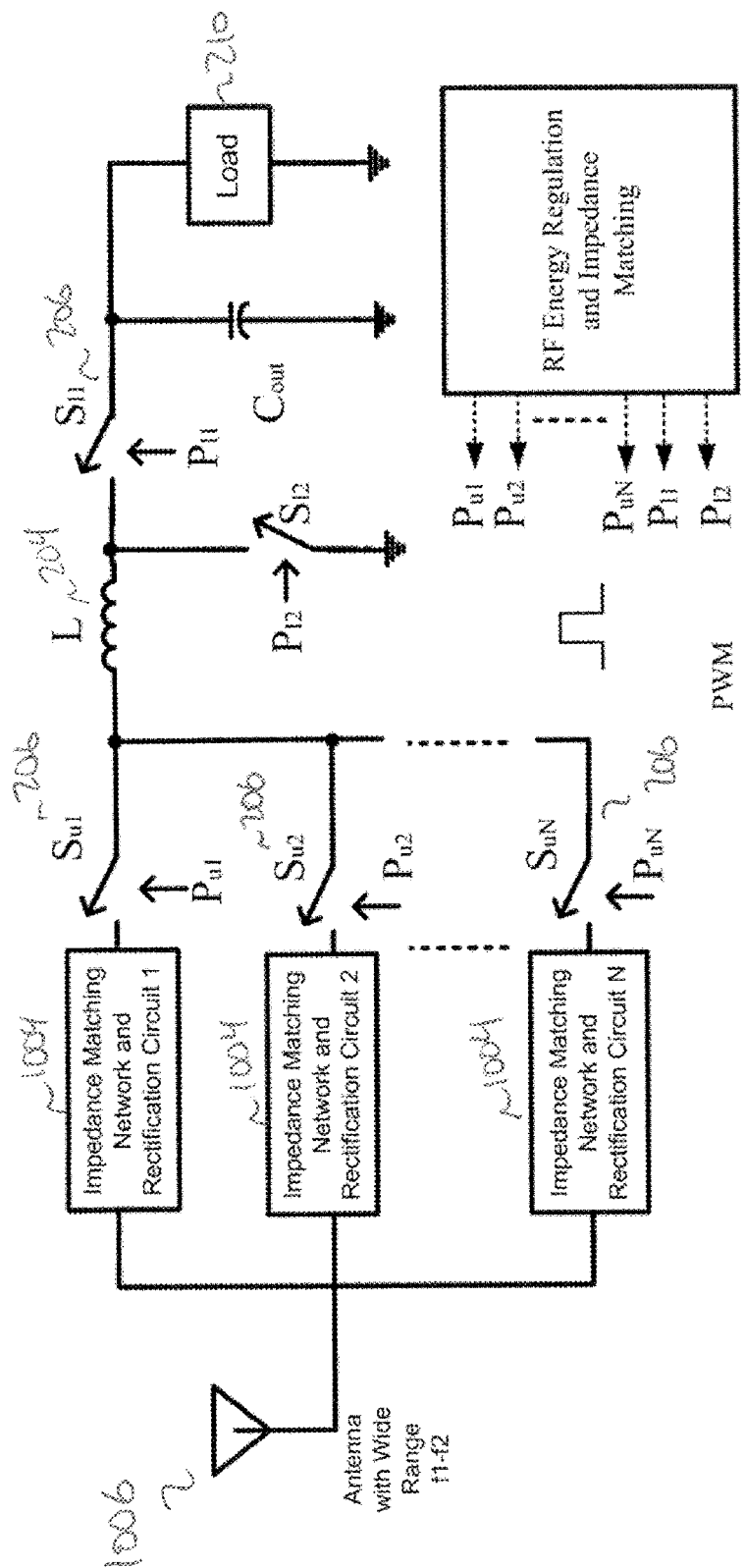
FIG. 10B illustrates a second RF energy harvesting system.
Figure 10C:
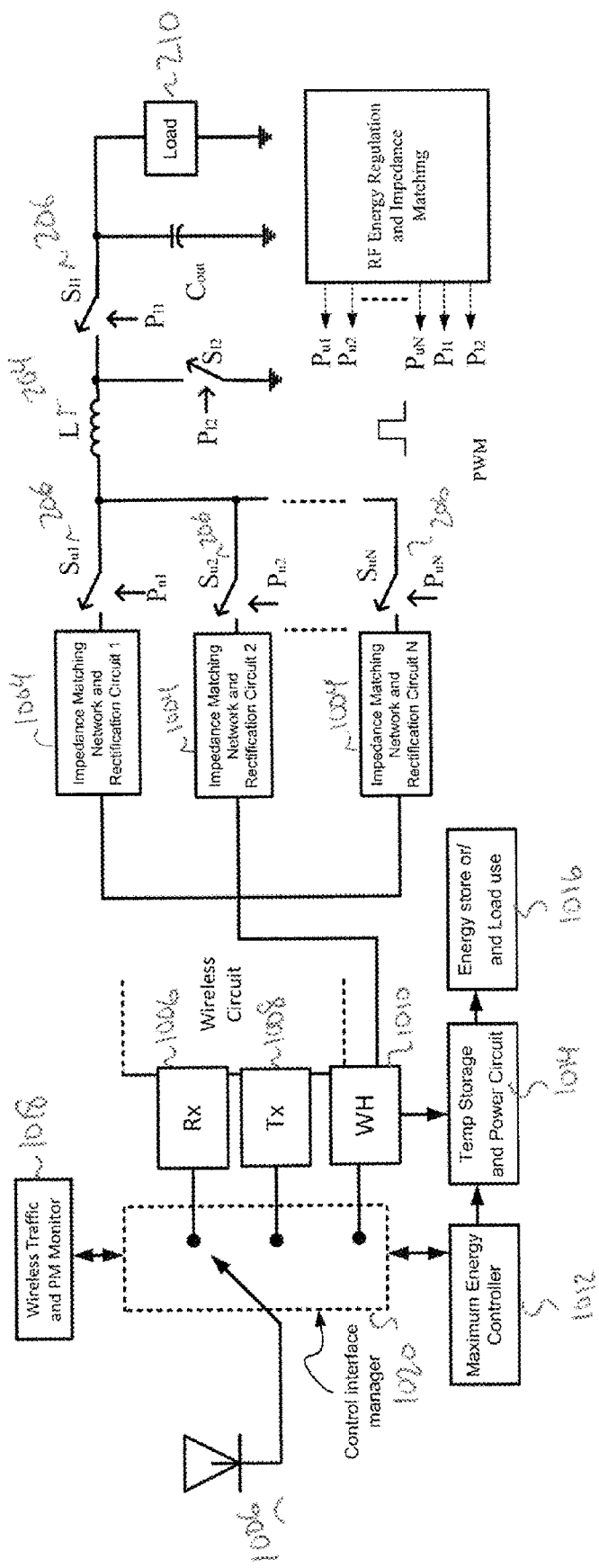
FIG. 10C illustrates a third RF energy harvesting system.

In yet another embodiment, the power circuit with modified control described previously may also be used for RF energy harvesting using a single power inductor. As used herein RF energy includes magnetic energy or any other types of wireless energy. As illustrated in FIGS. 10A and 10B, similar circuitry and control methods to that already described may be implemented, providing high efficiency at minimal cost. FIG. 10A illustrates a plurality of antennas 1002, each having an impedance matching network 1004, whereas FIG. 10B illustrates using a single antenna 1006 with a wide frequency range connected to impedance matching networks. The antenna may include transceiver circuitry, as illustrated in FIG. 10C. The wireless circuit may include a receiver 1006, a transmitter 1008, and wireless harvesting circuitry 1010, connected to a control interface manager 1020 that may also use a wireless traffic monitor 1018. An antenna 1006 may be used to harvest energy in wireless energy mode by converting wireless energy into electrical energy. Maximum energy controller 1012 may control the maximum amount of energy, along with a temporary storage and power circuit 1014 that receives power from wireless harvesting circuitry 1010. Power circuit 1014 may also be connected separately to an energy storage or load for use 1016. Further details of the transceiver circuitry may be found in WO 2010/030767, the contents of which are expressly incorporated herein, in its entirety. Each antenna/RF input could be optimized for different frequency ranges or for the same frequency as the other antenna/RF inputs. The inputs could also be receiving or transmitting wireless energy by using coils by electromagnetic induction or by resonant induction wireless power transfer (two coils that are coupled by electromagnetic induction and/or coupled at the same resonant frequency). Each input could also be receiving or receiving wireless energy by means of microwave energy and/or laser energy.

In the case when the antennas or coils are transmitting energy, the load may be replaced by an energy source.

Figure 11:
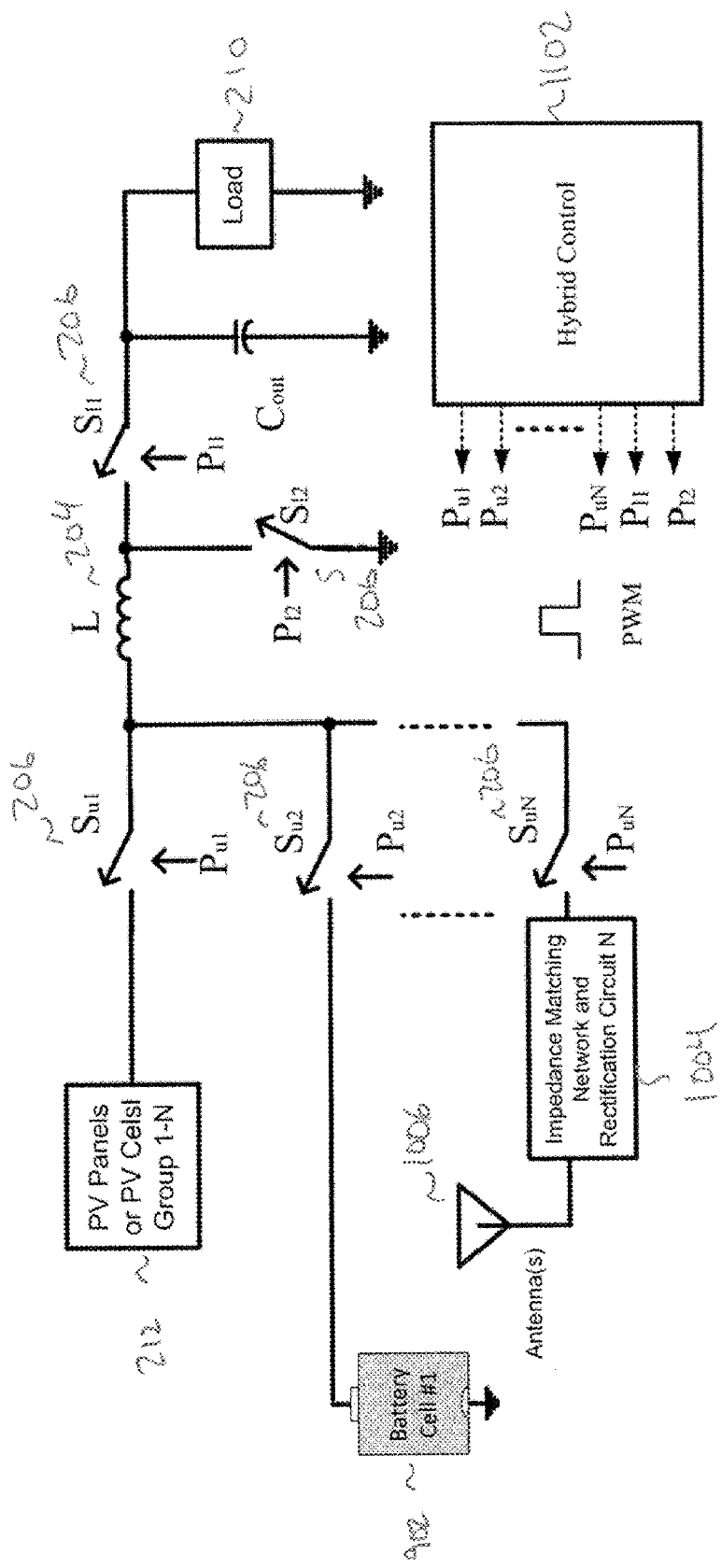
FIG. 11 illustrates a combined solar, battery, and RF energy harvesting system.

Further, various embodiments disclosed herein may be combined. For example, as shown in FIG. 11, the implementation of solar panels, battery cells for storage, and/or RF energy processing may all be combined to provide maximum efficiency in an alternative energy harvesting environment using a hybrid control unit 1102. It will be appreciated that other forms of energy harvesting may be used with the control methods described herein.

While the figures description heretofore generally show and describe embodiments of systems having multiple inputs and singular outputs, it is to be appreciated that this disclosure further contemplates system architectures comprised of a singular input and multiple outputs (loads) and system architectures comprised of a plurality of inputs and a plurality of outputs (loads). Essentially, in all of the above figures and description, the load side can be replaced to be the input from energy source and all or some of the inputs become the output loads. The energy can flow either direction. At least one of the plurality of cells can be replaced with a second load and the load can be replaced with a cell that provides energy such that the controller controls the power switches to transfer the energy from the cell that provides energy to the second load.

Figure 13A:
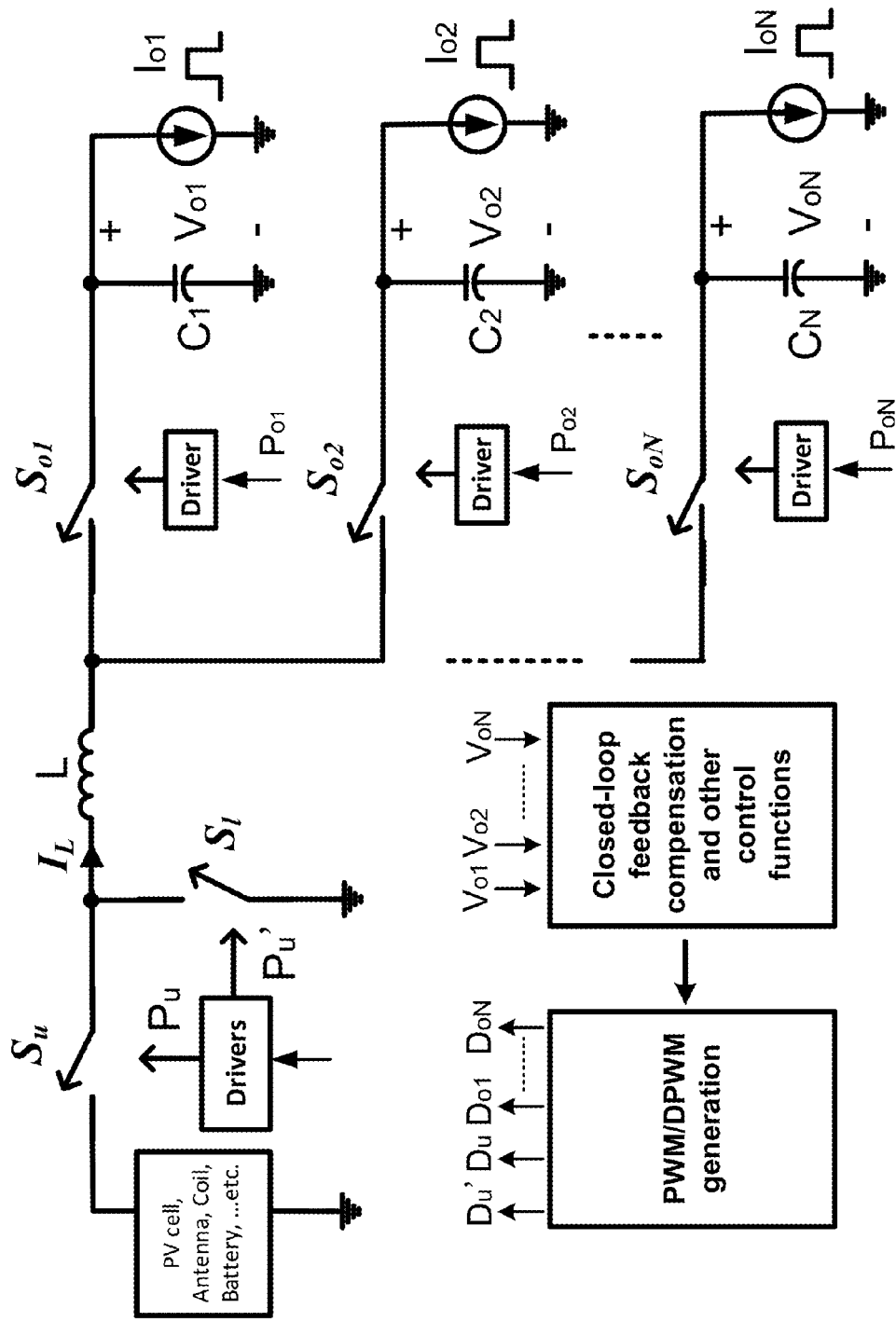
FIG. 13A illustrates an exemplary energy system architecture comprised of a singular energy source (e.g., a PV cell, an antenna, coil, battery, etc.) and multiple outputs (i.e., $V_o$ and $I_o$).
Figure 13B:
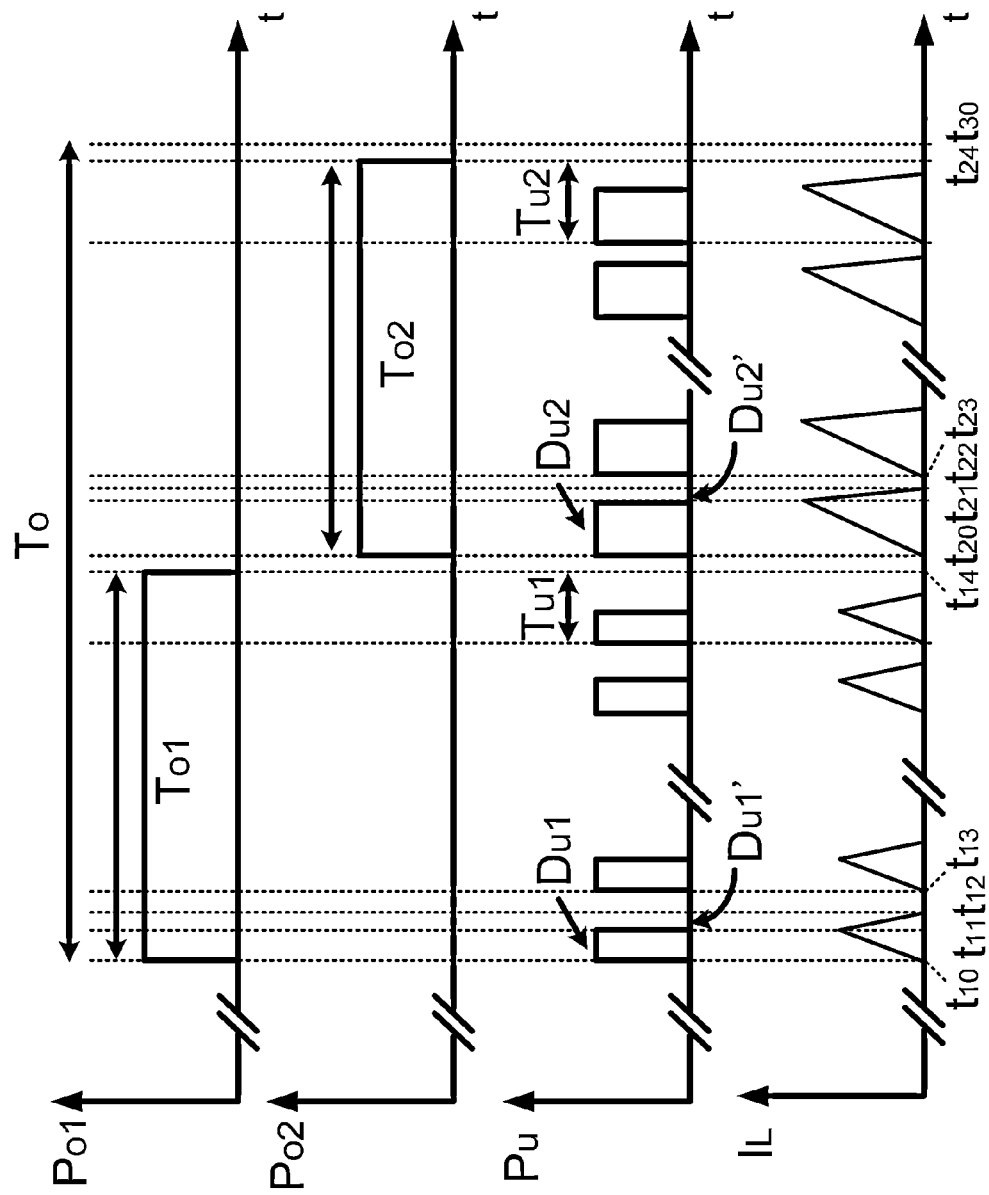
FIGS. 13B-13D show control operation waveforms for the exemplary system shown in FIG. 13A.
Figure 13C:
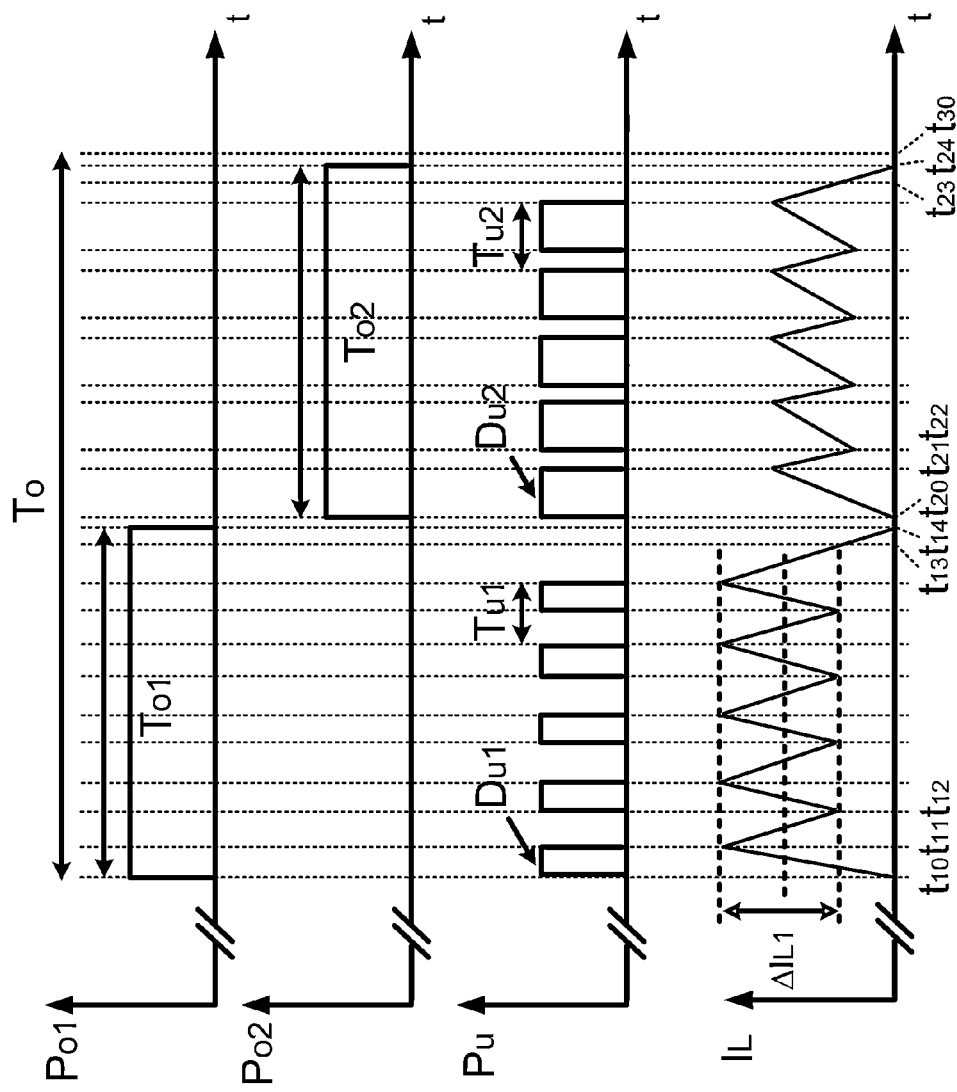
Figure 13D:
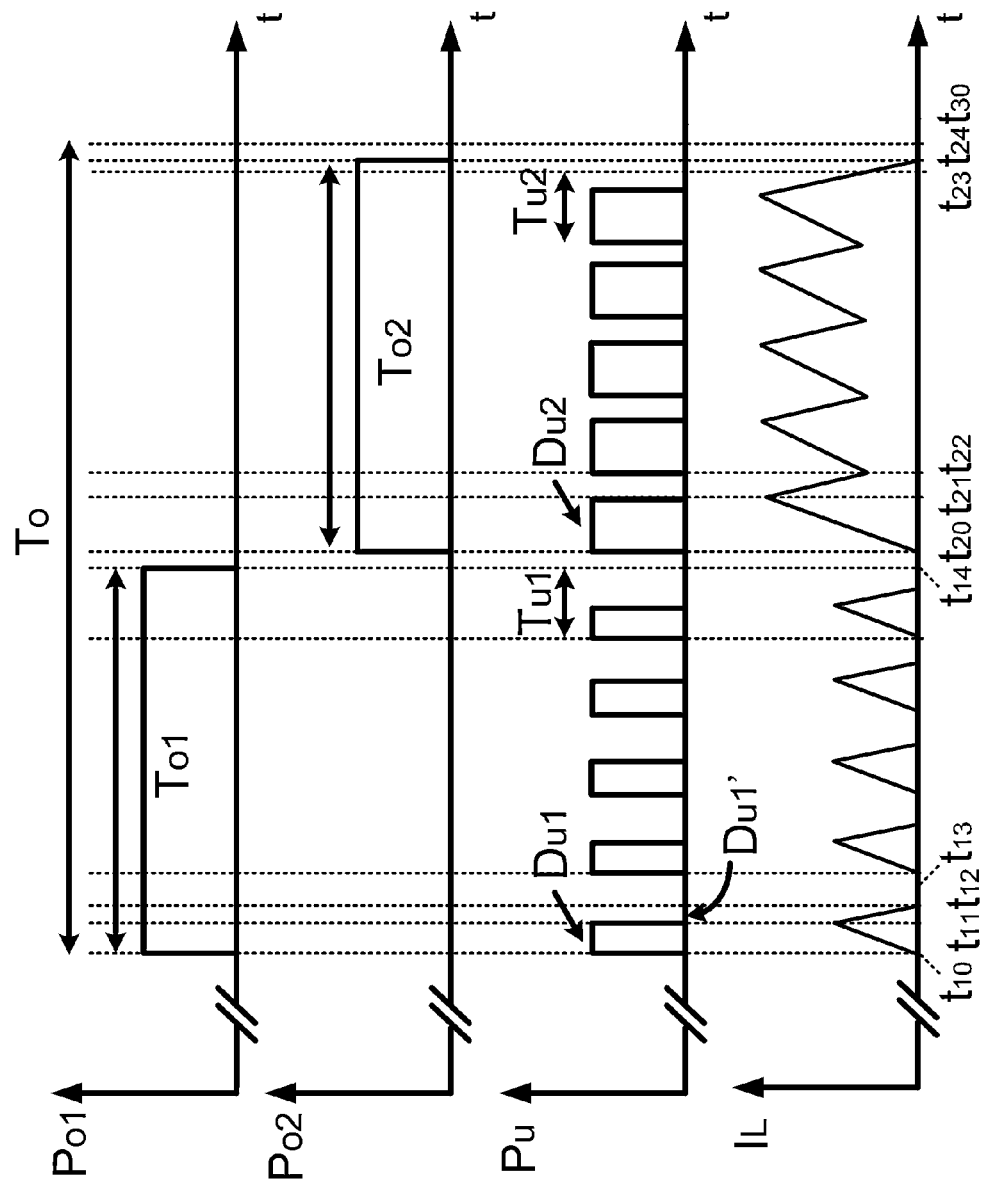

For example, FIG. 13A illustrates an exemplary energy system architecture comprised of a singular energy source (e.g., a PV cell, an antenna, coil, battery, etc.) and multiple outputs (i.e., $V_o$ and $I_o$). In this embodiment, at least one of the plurality of cells of FIGS. 1-12 has been replaced with a load (in the example of FIG. 13A, a plurality of loads, i.e., a second load) and the plurality of cells of FIGS. 1-12 has been replaced with a singular cell, such that the controller controls the power switches to transfer the energy from the cell that provides energy to the second load. FIGS. 13B-13D show control operation waveforms for the exemplary system shown in FIG. 13A. For example, FIG. 13B shows the operation waveforms when the switches are turned ON and OFF in a way such that the current of the inductor is always operating in Discontinuous Conduction Mode (DCM) when the energy is regulated to two outputs. Another example in FIG. 13C shows the operation waveforms when the switches are turned ON and OFF in a way such that the current of the inductor is always operating in Continuous Conduction Mode (CCM) when the energy is regulated to two outputs except during a small transition period where the current of the inductor is controlled to be discontinued to zero per this invention in order to prevent voltage/current spikes at the outputs. A third example shown in FIG. 13D the operation waveforms when the switches are turned ON and OFF in a way such that the current of the inductor is operating in DCM when regulating the energy to one output and is operating in CCM when regulating the energy to another output. As described herein, the current of the inductor can be controlled such that it can be discontinued to zero in order to maintain spike free (no overshoot or undershoot) of the voltages/currents.

Figure 14A:
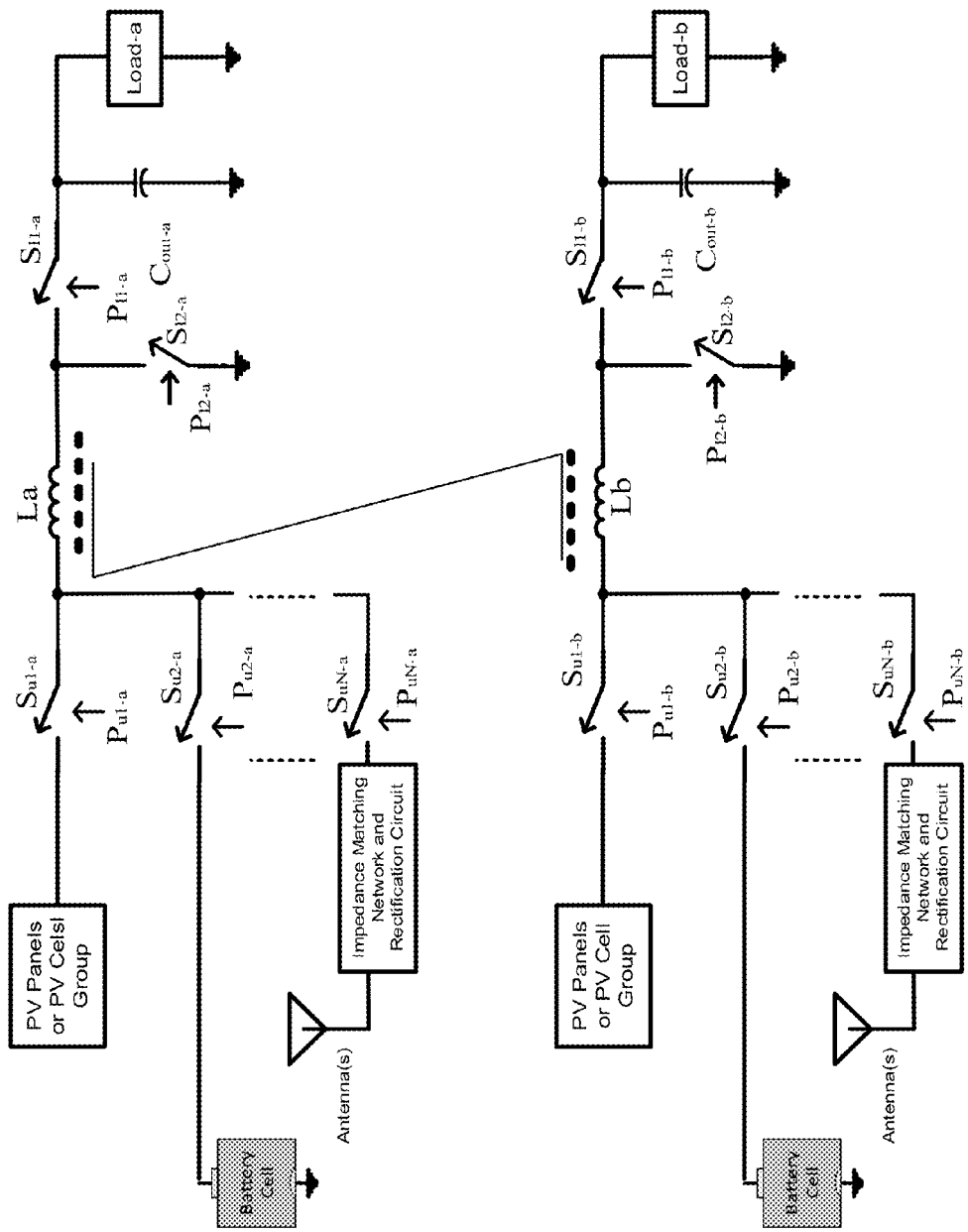
FIGS. 14A-14C show when the two or more of the disclosed circuits and controls are used together where the inductors are coupled together. The inductor can share the same magnetic cores and could include permanent magnets to increase saturation current of the inductors.
Figure 14B:
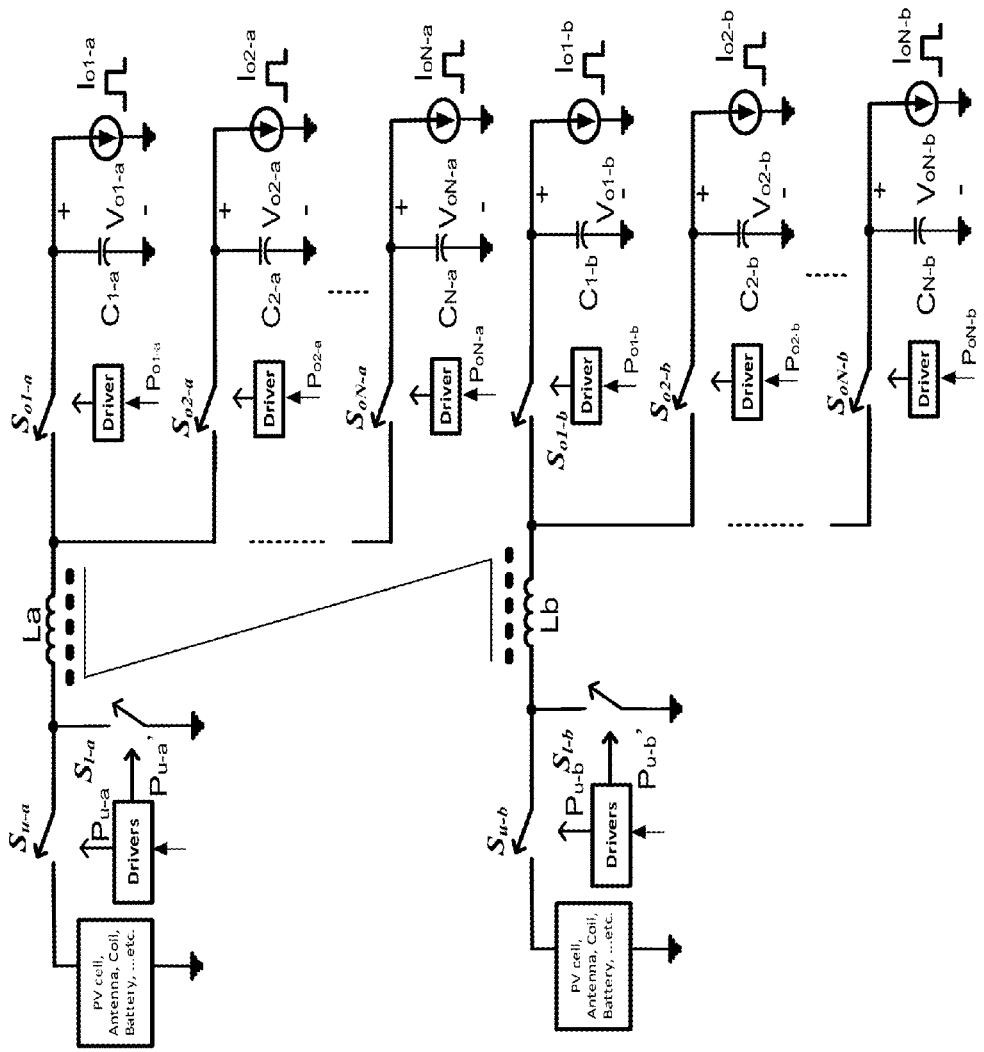
Figure 14C:
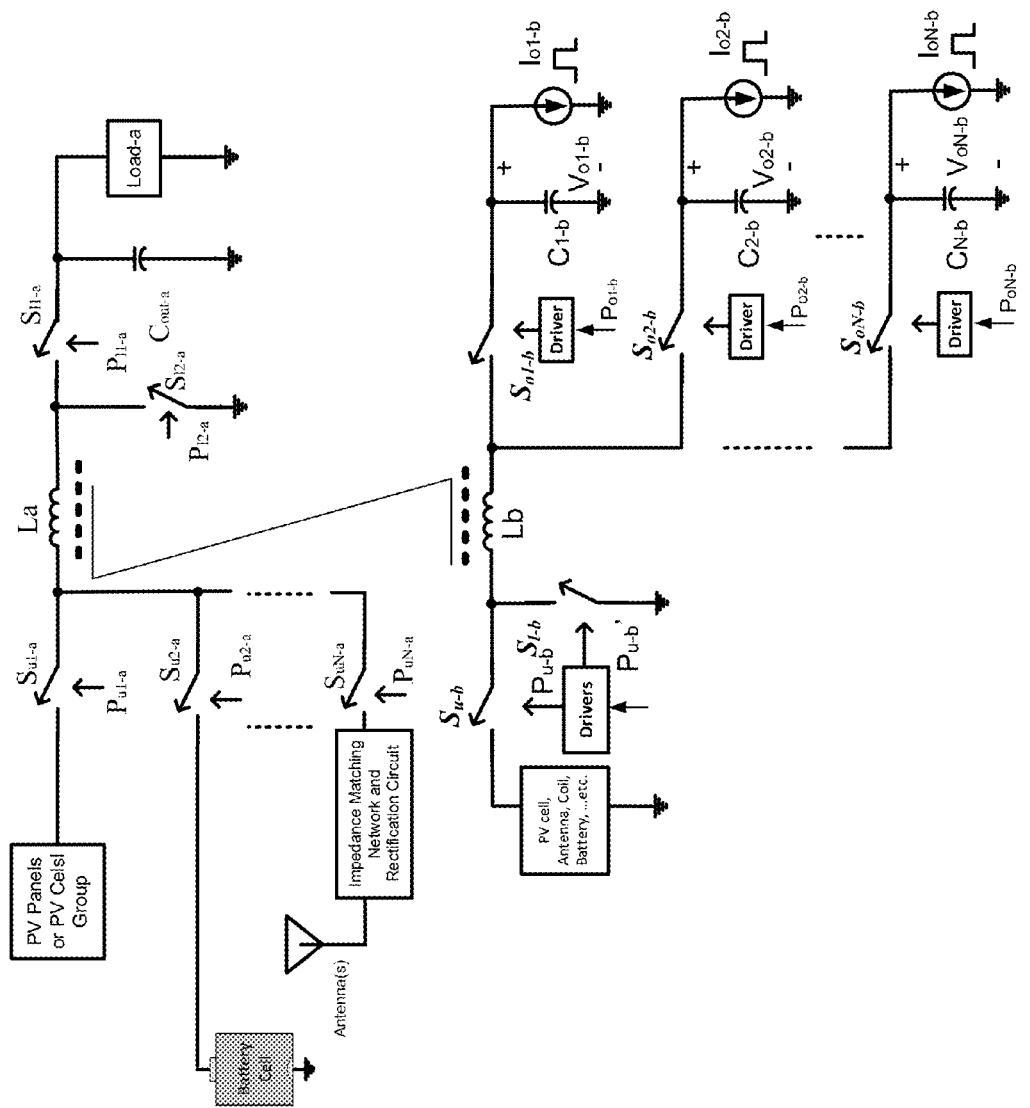

FIGS. 14A-14C show when the two or more of the disclosed circuits and controls are used together where the inductors are coupled together. The inductor can share the same magnetic cores and could include permanent magnets to increase saturation current of the inductors. Multiple of the multi-input multi-output circuits with the control methods presented here can be used with the power inductors are magnetically coupled together and/or placed on/in the same core or substrate in order to achieve size reduction and lower voltage/current ripple. A permanent magnet could also utilized to increase saturation current. This way, only one combined power inductor is needed for several circuits with several inputs and several outputs. For example FIG. 14A shows two sets of the circuit shown in FIG. 11 with their power inductors magnetically coupled and/or placed in/on the same core or substrate. Another example in FIG. 14B shows two sets of the circuit shown in FIG. 13A with their power inductors magnetically coupled and/or placed in/on the same core or substrate. A third example shows the inductor for the circuit in FIG. 11 magnetically coupled to the inductor for the circuit in FIG. 13A creating a circuit which has part with multiple inputs and has a part with multiple outputs. Each of these inductors when they are coupled or not coupled can have a permanent magnet for example for flux cancellation such that current saturation is increased.

It should be understood that the various techniques described herein may be implemented in connection with hardware or software or, where appropriate, with a combination thereof. Thus, the methods and apparatuses of the presently disclosed subject matter, or certain aspects or portions thereof, may take the form of program code (i.e., instructions) embodied in tangible media, such as CD-ROMs, hard drives, solid-state drives, or any other machine-readable storage medium wherein, when the program code is loaded into and executed by a machine, such as a computing device, the machine becomes an apparatus for practicing the presently disclosed subject matter. In the case of program code execution on programmable computers, the computing device generally includes a processor, a storage medium readable by the processor (including volatile and non-volatile memory and/or storage elements), at least one input device, and at least one output device. One or more programs may implement or utilize the processes described in connection with the presently disclosed subject matter, e.g., through the use of an application programming interface (API), reusable controls, or the like. Such programs may be implemented in a high level procedural or object-oriented programming language to communicate with a computer system. However, the program(s) can be implemented in assembly or machine language, if desired. In any case, the language may be a compiled or interpreted language and it may be combined with hardware implementations.

It should be appreciated that the logical operations described herein with respect to the various figures may be implemented (1) as a sequence of computer implemented acts or program modules (i.e., software) running on a computing device, (2) as interconnected machine logic circuits or circuit modules (i.e., hardware) within the computing device and/or (3) a combination of software and hardware of the computing device. Thus, the logical operations discussed herein are not limited to any specific combination of hardware and software. The implementation is a matter of choice dependent on the performance and other requirements of the computing device. Accordingly, the logical operations described herein are referred to variously as operations, structural devices, acts, or modules. These operations, structural devices, acts and modules may be implemented in software, in firmware, in special purpose digital logic, and any combination thereof. It should also be appreciated that more or fewer operations may be performed than shown in the figures and described herein. These operations may also be performed in a different order than those described herein.

It will be apparent to those skilled in the art that various modifications and variations can be made without departing from the scope or spirit. Other embodiments will be apparent to those skilled in the art from consideration of the specification and practice disclosed herein. It is intended that the specification and examples be considered as exemplary only, with a true scope and spirit being indicated by the following claims.

What is claimed is:

1. A system for processing or storing energy, comprising:
   a plurality of cells that provide energy;
   a plurality of power switches coupled respectively to each of the plurality of cells;
   a single inductor coupled to the plurality of power switches and in series with a load;
   a load power switch located between the inductor and the load;
   an output capacitor connected in parallel to the load and located between the load power switch and the load;
   a controller, wherein the controller controls the plurality of power switches and the load power switch to transfer the energy to the load.

2. The system of claim 1, wherein the controller has multiple inputs.

3. The system of claim 1, further comprising a sensor.

4. The system of claim 3, wherein the controller senses current, voltage and/or power output using the sensor for a first one of the plurality of cells and adjusts a duration that the power switch coupled to the first one of the plurality of cells remains open.

5. The system of claim 1, wherein each of the plurality of cells are solar panel cells.

6. The system of claim 1, wherein:
   each of the plurality of cells include solar panel cells, and
   the power switches are coupled to each of the solar panels including the solar panel cells.

7. The system of claim 1, wherein each of the plurality of cells are battery cells.

8. The system of claim 1, wherein at least one of the plurality of cells comprise an antenna, an impedance matching circuit, and a rectification circuit for recovering RF energy, magnetic energy, or other types of wireless energy, wherein the recovered wireless energy is conveyed to the power switches via the impedance matching and rectification circuits.

9. The system of claim 1, wherein the controller causes each of the plurality of power switches to be sequentially switched on and off, with each of the plurality of power switches in an on state for an equivalent duration of time, and wherein the controller further causes the load power switch to switch on and off a plurality of times during the equivalent duration of time when each of the plurality of power switches are in its respective on state.

10. The system of claim 9, wherein the controller causes a second of the plurality of power switches to switch to its on state before a first of the plurality of power switches switches to its off state.

11. The system of claim 9, wherein the controller causes a first of the plurality of power switches to switch to its off state before a second of the plurality of power switches switches to its on state.

12. The system of claim 9, wherein the controller causes the load power switch to switch on and off with an on state for a duration of time that is not equivalent for each of the plurality of times the load power switch switches on and off during the equivalent duration of time when each of the plurality of power switches are in its respective on state.

13. A method for processing or storing energy, comprising:
    a plurality of cells; and
    controlling, using a plurality of power switches coupled respectively to each of the plurality of cells, a single inductor coupled to the power switches and in series with a load, a load power switch located between the inductor and the load, and an output capacitor connected in parallel to the load and located between the load power switch and the load, transfer of energy from the plurality of cells to the load.

14. The method of claim 13, further including:
    sensing, using a sensor, the power output for a first one of the plurality of cells; and
    adjusting a duration that the power switch coupled to the first one of the plurality of cells remains open.

15. The method of claim 13, wherein the plurality of cells are solar panel cells.

16. The method of claim 13, wherein:
    the plurality of cells include solar panel cells, and
    the power switches are coupled to solar panels, each of the solar panels including the solar panel cells.

17. The method of claim 13, wherein the plurality of cells are battery cells.

18. The method of claim 13, wherein at least one of the plurality of cells comprise an antenna, an impedance matching network, and a rectification circuit and the method further includes:
    recovering RF energy, magnetic energy or other form of wireless energy using the antenna, the impedance matching network, and the rectification circuit,
    wherein the recovered wireless energy is conveyed to the power switches via the impedance matching and rectification circuits.

19. A computer-readable medium comprising instructions which, when executed by a processor, perform a method for processing and storing energy, the method comprising:
    a plurality of cells; and
    controlling, using a plurality of power switches coupled respectively to each of the plurality of cells, a single inductor coupled to the power switches and in series with a load, a load power switch located between the inductor and the load, and an output capacitor connected in parallel to the load and located between the load power switch and the load, transfer of energy from the plurality of cells to the load.

20. The computer-readable medium of claim 19, further including instructions that:
    sense, using a sensor, the power output for a first one of the plurality of cells; and adjust a duration that the power switch coupled to the first one of the plurality of cells remains open.

21. The computer-readable medium of claim 19, wherein the plurality of cells are solar panel cells.

22. The computer-readable medium of claim 19, wherein:
the plurality of cells include solar panel cells, and
the power switches are coupled to solar panels, each of the solar panels including the solar panel cells.

23. The computer-readable medium of claim 19, wherein the plurality of cells are battery cells.

24. The computer-readable medium of claim 19, wherein at least one of the plurality of cells comprise an antenna, an impedance matching network, and a rectification circuit and the method further includes instructions which, when executed by the processor:
recover RF energy or other form of wireless energy using the antenna, the impedance matching network, and the rectification circuit,
wherein the recovered wireless energy is conveyed to the power switches via the impedance matching and rectification circuits.

\* \* \* \* \*